United States Patent
Tanaka et al.

(10) Patent No.: US 11,211,407 B2
(45) Date of Patent: Dec. 28, 2021

(54) DISPLAY DEVICE

(71) Applicant: Samsung Display Co., LTD., Yongin-si (KR)

(72) Inventors: Tetsuhiro Tanaka, Hwaseong-si (KR); Yeong-Gyu Kim, Seoul (KR); Ki Seong Seo, Seoul (KR); Seung Hyun Lee, Asan-si (KR); Chang Ho Yi, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/986,933

(22) Filed: Aug. 6, 2020

(65) Prior Publication Data

US 2021/0210518 A1 Jul. 8, 2021

(30) Foreign Application Priority Data

Jan. 3, 2020 (KR) .................. 10-2020-0000988

(51) Int. Cl.
*H01L 27/12* (2006.01)
*G09G 3/32* (2016.01)
*H01L 27/32* (2006.01)

(52) U.S. Cl.
CPC .......... *H01L 27/1225* (2013.01); *G09G 3/32* (2013.01); *H01L 27/1237* (2013.01);
(Continued)

(58) Field of Classification Search
CPC ............. H01L 27/1237; H01L 27/1248; H01L 27/1255; H01L 27/1225; H01L 27/3258;
(Continued)

(56) References Cited

U.S. PATENT DOCUMENTS 9,123,574 B2 * 9/2015 Yamazaki ......... H01L 27/11517
9,960,281 B2 5/2018 Lu et al.
(Continued)

FOREIGN PATENT DOCUMENTS

KR 10-2016-0043327 4/2016
KR 10-2019-0042132 4/2019
(Continued)

*Primary Examiner* — Vinh T Lam
(74) *Attorney, Agent, or Firm* — Kile Park Reed & Houtteman PLLC

(57) ABSTRACT

A display device includes a polycrystalline semiconductor including a channel, a first electrode, and a second electrode of a driving transistor, a first gate insulating layer, a gate electrode of a driving transistor, a first electrode of a boost capacitor, a second gate insulating layer, a first interlayer insulating layer, an oxide semiconductor including a channel, a first electrode, and a second electrode of a second transistor, a channel, a first electrode, and a second electrode of a third transistor, and a second electrode of a boost capacitor, a third gate insulating layer disposed on the oxide semiconductor, a gate electrode of the second transistor overlapping the channel of the second transistor, a gate electrode of the third transistor overlapping the channel of the third transistor, and a second interlayer insulating layer disposed on the gate electrode of the second transistor and the gate electrode of the third transistor.

20 Claims, 14 Drawing Sheets

(52) U.S. Cl.
CPC . *H01L 27/1248* (2013.01); *G09G 2300/0842* (2013.01); *G09G 2310/06* (2013.01); *G09G 2330/028* (2013.01); *H01L 27/1255* (2013.01); *H01L 27/3258* (2013.01)

(58) Field of Classification Search
CPC ..... G09G 2330/028; G09G 2300/0842; G09G 3/32; G09G 2310/06
See application file for complete search history.

(56) References Cited

U.S. PATENT DOCUMENTS

| | | | |
|---|---|---|---|
| 10,600,875 B2* | 3/2020 | Murakawa | H01L 29/78648 |
| 10,804,272 B2* | 10/2020 | Kimura | H01L 27/0688 |
| 10,886,412 B2* | 1/2021 | Yamazaki | C01B 33/113 |
| 11,031,403 B2* | 6/2021 | Yamazaki | H01L 21/31116 |
| 11,081,326 B2* | 8/2021 | Yamazaki | H01L 29/78648 |
| 2016/0104427 A1* | 4/2016 | Matsueda | G09G 3/3233 |
| | | | 345/212 |
| 2016/0171927 A1* | 6/2016 | Kang | G09G 3/3233 |
| | | | 345/212 |
| 2016/0203794 A1* | 7/2016 | Lim | G09G 3/3225 |
| | | | 345/213 |
| 2016/0275870 A1* | 9/2016 | Kimura | G09G 3/3258 |
| 2017/0110048 A1* | 4/2017 | Kim | G09G 3/325 |
| 2019/0393291 A1* | 12/2019 | Jeon | G09G 3/3233 |
| 2020/0135091 A1* | 4/2020 | Kim | G09G 3/32 |

FOREIGN PATENT DOCUMENTS

| | | |
|---|---|---|
| KR | 10-2019-0042899 | 4/2019 |
| KR | 10-2019-0051504 | 5/2019 |

* cited by examiner

DISPLAY DEVICE

CROSS-REFERENCE TO RELATED APPLICATION(S)

This application claims priority to and benefits of Korean Patent Application No. 10-2020-0000988 under 35 U.S.C. § 119, filed in the Korean Intellectual Property Office on Jan. 3, 2020, the entire contents of which are incorporated herein by reference.

BACKGROUND

1. Technical Field

The disclosure relates to a display device.

2. Description of the Related Art

An organic light emitting device may include two electrodes and an organic emission layer disposed therebetween, and electrons injected from one electrode may be combined with holes injected from the other electrode on an organic emission layer to form excitons. The excitons may transit to a ground state from an excited state to output energy and emit light.

The organic light emitting device may include pixels including an organic light emitting diode that may be a self-light-emitting device. Transistors and at least one capacitor for driving the organic light emitting diode may be formed on respective pixels. The transistors may include a switching transistor and a driving transistor.

A number of pixels may be increased so as to increase a resolution of the organic light emitting device, an aperture ratio may be reduced in a high-speed driving process so as to realize stable video, a current density may be increased, and a driving voltage may increase. Accordingly, stains may be generated, and reliability of elements such as transistors may be deteriorated.

The above information disclosed in this Background section is only for enhancement of understanding of the background of the described technology. The above may contain information that does not form the prior art that is already known to a person of ordinary skill in the art before the effective filing date of this disclosure.

SUMMARY

The described technology has been made in an effort to improve reliability of components of a high-resolution display device driven at a high speed.

An embodiment may provide a display device that may include a polycrystalline semiconductor including a channel, a first electrode, and a second electrode of a driving transistor disposed on a substrate, a first gate insulating layer disposed on the polycrystalline semiconductor, and a gate electrode of the driving transistor disposed on the first gate insulating layer and overlapping a channel of the driving transistor. The display device may include a first electrode of a boost capacitor disposed on the first gate insulating layer, a second gate insulating layer disposed on the gate electrode of the driving transistor and the first electrode of the boost capacitor, and a first interlayer insulating layer disposed on the second gate insulating layer. The display device may include an oxide semiconductor disposed on the first interlayer insulating layer, and including a channel, a first electrode, and a second electrode of a second transistor, a channel, a first electrode, and a second electrode of a third transistor, and a second electrode of a boost capacitor. The display device may include a third gate insulating layer disposed on the oxide semiconductor, a gate electrode of the second transistor disposed on the third gate insulating layer, and overlapping the channel of the second transistor, a gate electrode of the third transistor disposed on the third gate insulating layer, and overlapping the channel of the third transistor, and a second interlayer insulating layer disposed on the gate electrode of the second transistor and the gate electrode of the third transistor. A hydrogen concentration of the first interlayer insulating layer, the third gate insulating layer, and the second interlayer insulating layer may be lower than a hydrogen concentration of the first gate insulating layer and the second gate insulating layer. The first electrode and the second electrode of the second transistor of the oxide semiconductor, the first electrode and the second electrode of the third transistor, and the second electrode of the boost capacitor may be doped with at least one selected from the group consisting of boron, phosphorus, argon, xenon, and krypton.

The third gate insulating layer may be disposed on a top surface of the oxide semiconductor and the first interlayer insulating layer.

The third gate insulating layer may be disposed on a substantially entire surface of the top surface of the oxide semiconductor and the first interlayer insulating layer.

The third gate insulating layer may cover the top surface and a side surface of the oxide semiconductor.

A hydrogen concentration of the first interlayer insulating layer may be less than about $1.0E^{+21}$ atoms/cm$^3$.

A hydrogen concentration of the third gate insulating layer may be less than about 1.14E+21 atoms/cm3.

A hydrogen concentration of the second interlayer insulating layer may be less than about 1.0E+22 atoms/cm3.

A doping concentration of a source region and a drain region of the oxide semiconductor may be equal to or greater than about 5E+18 cm-3.

Another embodiment may provide a display device that may include a light emitting diode electrically connected between a driving voltage line for applying a driving voltage and a common voltage line for applying a common voltage, a driving transistor electrically connected between the driving voltage line and the light emitting diode, and a second transistor electrically connected between a first electrode of the driving transistor electrically connected to the driving voltage line and a data line for applying a data voltage. The display device may include a third transistor electrically connected between a second electrode of the driving transistor electrically connected to the light emitting diode and a gate electrode of the driving transistor, a fourth transistor electrically connected between the gate electrode of the driving transistor and a first initialization voltage line for applying a first initialization voltage, a storage capacitor electrically connected between the driving voltage line and the gate electrode of the driving transistor, and a boost capacitor electrically connected between a gate electrode of the second transistor and the gate electrode of the driving transistor.

The gate electrode of the second transistor may be electrically connected to a scan line for applying a scan signal, a gate electrode of the third transistor may be electrically connected to an inverted scan line for applying an inverted scan signal, and a voltage with an opposite polarity to a voltage applied to the scan line may be applied to the inverted scan line, wherein the voltage with the opposite polarity and the voltage applied to the scan line are simultaneously applied.

The driving transistor and the second transistor may include a polycrystalline semiconductor, the third transistor and the fourth transistor may include an oxide semiconductor, and at least part of the oxide semiconductor may be doped with at least one selected from the group consisting of boron, phosphorus, argon, xenon, and krypton.

The driving transistor and the second transistor may be p-type transistors, and the third transistor and the fourth transistor may be n-type transistors.

The boost capacitor may include an electrode electrically connected to the gate electrode of the driving transistor, and the electrode of the boost capacitor may be doped with at least one selected from the group consisting of boron, phosphorus, argon, xenon, and krypton.

The display device may further include a fifth transistor electrically connected between the driving voltage line and the first electrode of the driving transistor, a sixth transistor electrically connected between the first electrode of the driving transistor and the light emitting diode; and a seventh transistor electrically connected between a second initialization voltage line for applying a second initialization voltage and the light emitting diode.

Yet another embodiment may provide a display device that may include a polycrystalline semiconductor disposed on a substrate, a first gate insulating layer disposed on the polycrystalline semiconductor, a driving gate electrode disposed on the first gate insulating layer, a second gate insulating layer disposed on the driving gate electrode, and a first interlayer insulating layer disposed on the second gate insulating layer. The display device may include an oxide semiconductor disposed on the first interlayer insulating layer, a third gate insulating layer disposed on the oxide semiconductor, a switching gate electrode disposed on the third gate insulating layer, and a second interlayer insulating layer disposed on the switching gate electrode. A hydrogen concentration of the first interlayer insulating layer, the third gate insulating layer, and the second interlayer insulating layer may be lower than a hydrogen concentration of the first gate insulating layer and the second gate insulating layer. The oxide semiconductor may include a channel, a source region and a drain region. The source region and the drain region of the oxide semiconductor may be doped with at least one selected from the group consisting of boron, phosphorus, argon, xenon, and krypton.

The third gate insulating layer may be disposed on a substantially entire surface of a top surface of the oxide semiconductor and the first interlayer insulating layer, and the third gate insulating layer may cover the channel of the oxide semiconductor, and a top surface and a side surface of the source region and the drain region of the oxide semiconductor.

A hydrogen concentration of the first interlayer insulating layer may be less than about $1.0E+21$ atoms/cm3.

A hydrogen concentration of the third gate insulating layer may be less than about $1.14E+21$ atoms/cm3.

A hydrogen concentration of the second interlayer insulating layer may be less than about $1.0E+22$ atoms/cm3.

A doping concentration of the source region and the drain region of the oxide semiconductor may be equal to or greater than about $5E+18$ cm-3.

According to embodiments, reliability of the components of the display device may be improved.

DETAILED DESCRIPTION OF THE EMBODIMENTS

Figure 1:
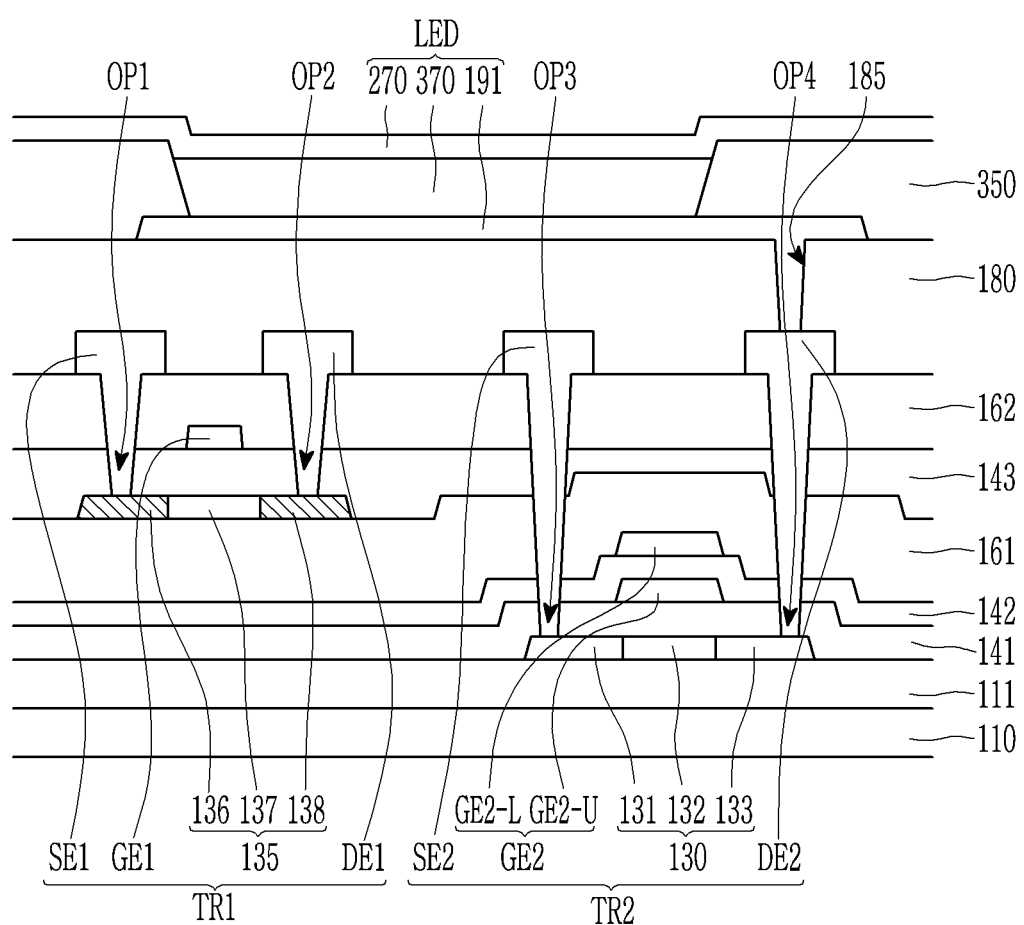
FIG. 1 shows a schematic cross-sectional view of part of a display device according to an embodiment.

The invention will be described more fully hereinafter with reference to the accompanying drawings, in which embodiments of the invention are shown. As those skilled in the art would realize, the described embodiments may be modified in various different ways, all without departing from the spirit or scope of the invention.

The drawings and description are to be regarded as illustrative in nature and not restrictive, and like reference numerals designate like elements throughout the specification.

Further, the size and thickness of each configuration shown in the drawings may be arbitrarily shown for better understanding and ease of description, and the invention is not limited thereto. In the drawings, the thickness of layers, films, panels, regions, etc., may be exaggerated for clarity. For better understanding and ease of description, the thicknesses of some layers and areas may be exaggerated.

As used herein, the singular forms "a," "an" and "the" are intended to include the plural forms as well, unless the context clearly indicates otherwise.

The term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

The phrase "at least one of" is intended to include the meaning of "at least one selected from the group of" for the purpose of its meaning and interpretation. For example, "at least one of A and B" may be understood to mean "A, B, or A and B."

It will be understood that when an element such as a layer, film, region, or substrate is referred to as being "on" another element, it can be directly on the other element or intervening elements may also be present. In contrast, when an element is referred to as being "directly on" another element, there may be no intervening elements present. Further, the word "on" or "above" means positioned on or below the object portion, and does not necessarily mean positioned on the upper side of the object portion based on a gravitational direction.

Unless explicitly described to the contrary, the words "comprise", "has", "have", and "include", and variations such as "comprises", "comprising", "having", "includes", and "including" will be understood to imply the inclusion of stated elements but not the exclusion of any other elements.

The phrase "on a plane" may mean viewing the object portion from the top, and the phrase "on a cross-section" may mean viewing a cross-section of which the object portion may be vertically cut from the side.

The term "overlap" may include layer, stack, face or facing, extending over, extending under, covering or partly covering or any other suitable term as would be appreciated and understood by those of ordinary skill in the art. The phrase "not overlap" may include apart from or set aside from or offset from and any other suitable equivalents as would be appreciated and understood by those of ordinary skill in the art.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

A display device according to an embodiment will now be described with reference to FIG. 1.

FIG. 1 shows a schematic cross-sectional view of part of a display device according to an embodiment. For better comprehension and ease of description, regarding the display device, FIG. 1 illustrates a first transistor TR1, a second transistor TR2, and a light emitting diode (LED) electrically connected to the second transistor TR2. The first transistor TR1 may be a switching transistor. The second transistor TR2 may be a driving transistor.

A buffer layer 111 may be disposed on a substrate 110. The substrate 110 may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. The substrate 110 may include a flexible material that may be folded or bent, and it may be single-layered or multi-layered.

The buffer layer 111 may have a single-layered or multi-layered structure. The buffer layer 111 is illustrated to be a single layer in FIG. 1, but it may be multi-layered depending on embodiments. The buffer layer 111 may include an organic insulating material, an inorganic insulating material, or a combination thereof. For example, the buffer layer 111 may include a silicon nitride, a silicon oxide, or a silicon oxynitride.

A second semiconductor 130 may be disposed on the buffer layer 111. The second semiconductor 130 may include a polycrystalline silicon material. For example, the second semiconductor 130 may be made of a polycrystalline semiconductor. The second semiconductor 130 may include a source region 131, a channel region 132, and a drain region 133.

A source region 131 of the second semiconductor 130 may be electrically connected to a second source electrode SE2, and a drain region 133 of the second semiconductor 130 may be electrically connected to a second drain electrode DE2.

A first gate insulating layer 141 may be disposed on the second semiconductor 130. The first gate insulating layer 141 may include a silicon nitride a silicon oxide, or a combination thereof.

A second gate lower electrode (GE2-U) may be disposed on the first gate insulating layer 141. A second gate insulating layer 142 may be disposed on the second gate lower electrode (GE2-U). The second gate insulating layer 142 may include a silicon nitride, a silicon oxide, or a combination thereof.

A second gate upper electrode (GE2-L) may be disposed on the second gate insulating layer 142. The second gate lower electrode (GE2-U) may overlap the second gate upper electrode (GE2-L) with the second gate insulating layer 142 therebetween. The second gate upper electrode (GE2-L) and the second gate lower electrode (GE2-U) may configure a second gate electrode GE2. The second gate electrode GE2 may overlap the channel region 132 of the second semiconductor 130 in a vertical direction with respect to the substrate 110.

The second semiconductor 130, the second gate electrode GE2, the second source electrode SE2, and the second drain electrode DE2 may configure a second transistor TR2. The second transistor TR2 may be a driving transistor electrically connected to the light emitting diode (LED), and it may be formed as a transistor including a polycrystalline semiconductor.

A first interlayer insulating layer 161 may be disposed on the second gate electrode GE2. The first interlayer insulating layer 161 may include a silicon nitride, a silicon oxide, or a combination thereof. The first interlayer insulating layer 161 may be configured to be a multilayer having a layer including a silicon nitride and a layer including a silicon oxide. In this instance, the layer including a silicon nitride on the first interlayer insulating layer 161 may be disposed nearer the substrate 110 than the layer including a silicon oxide may be.

A first semiconductor 135 may be disposed on the first interlayer insulating layer 161.

The first semiconductor 135 may be made of an oxide semiconductor. The oxide semiconductor may include: at least one of unary metal oxides such as an indium (In) oxide, a tin (Sn) oxide, a zinc (Zn) oxide, or a combination thereof; binary metal oxides such as an In—Zn based oxide, an Sn—Zn based oxide, an Al—Zn based oxide, a Zn—Mg based oxide, an Sn—Mg based oxide, an In—Mg based oxide, an In—Ga based oxide, or a combination thereof; ternary metal oxides such as an In—Ga—Zn based oxide, an In—Al—Zn based oxide, an In—Sn—Zn based oxide, an Sn—Ga—Zn based oxide, an Al—Ga—Zn based oxide, an Sn—Al—Zn based oxide, an In—Hf—Zn based oxide, an In—La—Zn based oxide, an In—Ce—Zn based oxide, an In—Pr—Zn based oxide, an In—Nd—Zn based oxide, an In—Sm—Zn based oxide, an In—Eu—Zn based oxide, an In—Gd—Zn based oxide, an In—Tb—Zn based oxide, an In—Dy—Zn based oxide, an In—Ho—Zn based oxide, an In—Er—Zn based oxide, an In—Tm—Zn based oxide, an In—Yb—Zn based oxide, an In—Lu—Zn based oxide, or a combination thereof; and quaternary metal oxides such as an In—Sn—Ga—Zn based oxide, an In—Hf—Ga—Zn based oxide, an In—Al—Ga—Zn based oxide, an In—Sn—Al—Zn based oxide, an In—Sn—Hf—Zn based oxide, an In—Hf—Al—Zn based oxide, or a combination thereof. For example, the first semiconductor 135 may include the indium-gallium zinc oxide (IGZO) from among the In—Ga—Zn based oxide.

The first semiconductor 135 may include a source region 136, a channel region 137, and a drain region 138. The source region 136 of the first semiconductor 135 may be electrically connected to a first source electrode SE1, and the drain region 138 of the first semiconductor 135 may be electrically connected to a first drain electrode DE1.

A third gate insulating layer 143 may be disposed on the first semiconductor 135. In an embodiment described with reference to FIG. 1, the third gate insulating layer 143 may be disposed on the top surface of the first semiconductor 135 and the first interlayer insulating layer 161. The third gate insulating layer 143 may be disposed on a substantially entire surface of the top surface of the first semiconductor 135 and the first interlayer insulating layer 161. Therefore, the third gate insulating layer 143 covers top surfaces and side surfaces of the source region 136, the channel region 137, and the drain region 138 of the first semiconductor 135.

In the process for realizing high resolution, the size of the pixels may be reduced, and a length of the channel of the semiconductor may be reduced. In this instance, in case that the third gate insulating layer 143 does not cover the top surfaces of the source region 136 and the drain region 138, a portion of material of the first semiconductor 135 may move to the side surface of the third gate insulating layer 143. For example, in case that the first semiconductor 135 may be made of an oxide semiconductor including indium, indium particles may be disposed on the side surface of the third gate insulating layer 143, and the first semiconductor 135 and the first gate electrode GE1 by be short-circuited by the indium particles. In an embodiment, the third gate insulating layer 143 may be provided on the top surface (e.g., entire top surface) of the first semiconductor 135 and the first interlayer insulating layer 161, thereby preventing the short-circuit of the first semiconductor 135 and the first gate electrode GE1.

However, embodiments are not limited thereto, and the third gate insulating layer 143 may not be disposed on the top surface of the first semiconductor 135 and the first interlayer insulating layer 161. For example, the third gate insulating layer 143 may be disposed between the first gate electrode GE1 and the first semiconductor 135. For example, the third gate insulating layer 143 may overlap the channel region 137 of the first semiconductor 135, and may not overlap the source region 136 and the drain region 138.

A first gate electrode GE1 may be disposed on the third gate insulating layer 143. The first gate electrode GE1 may overlap the channel region 137 of the first semiconductor 135 in the vertical direction with respect to the substrate 110.

The first semiconductor 135, the first gate electrode GE1, the first source electrode SE1, and the first drain electrode DE1 may configure a first transistor TR1. The first transistor TR1 may be a switching transistor for a switching of the second transistor TR2, and it may be formed as a transistor including an oxide semiconductor.

A second interlayer insulating layer 162 may be disposed on the first gate electrode GE1. The first source electrode SE1, the first drain electrode DE1, the second source electrode SE2, and the second drain electrode DE2 may be disposed on the second interlayer insulating layer 162. A first opening OP1, a second opening OP2, a third opening OP3, and a fourth opening OP4 may be formed in the second interlayer insulating layer 162. The first opening OP1 may overlap the first source electrode SE1, and the second opening OP2 may overlap the first drain electrode DE1. The third opening OP3 may overlap the second source electrode SE2, and the fourth opening OP4 may overlap the second drain electrode DE2.

The first source electrode SE1 may be electrically connected to the source region 136 of the first semiconductor 135 through the first opening OP1. The first drain electrode DE1 may be electrically connected to the drain region 138 of the first semiconductor 135 through the second opening OP2.

The second source electrode SE2 may be electrically connected to the source region 131 of the second semiconductor 130 of the third opening OP3. The second drain electrode DE2 may be electrically connected to the drain region 133 of the second semiconductor 130 through the fourth opening OP4.

A third interlayer insulating layer 180 may be disposed on the first source electrode SE1, the first drain electrode DE1, the second source electrode SE2, and the second drain electrode DE2. An opening 185 may be formed in the third interlayer insulating layer 180. The opening 185 of the third interlayer insulating layer 180 may overlap the second drain electrode DE2.

An anode 191 may be disposed on the third interlayer insulating layer 180. The anode 191 may be electrically connected to the second drain electrode DE2 through the opening 185 of the third interlayer insulating layer 180.

A partition wall 350 may be disposed on the anode 191. An opening may be formed in the partition wall 350, and the opening of the partition wall 350 may overlap the anode 191. A light-emitting device layer 370 may be disposed in the opening of the partition wall 350.

A cathode 270 may be provided on the light-emitting device layer 370 and the partition wall 350. The anode 191, the light-emitting device layer 370, and the cathode 270 may configure a light emitting diode (LED).

Regarding the display device according to an embodiment, the first transistor TR1 that may be a switching transistor may include an oxide semiconductor, and the second transistor TR2 that may be a driving transistor may include a polycrystalline semiconductor. A motion of video may be expressed more naturally by increasing the existing frequency of about 60 Hz to about 120 Hz for high-speed driving, by which, however, the driving voltage may increase. To compensate for the increased driving voltage, the frequency when driving a still image may be reduced. For example, a still image may be driven at about 1 Hz. In case that the frequency may be lowered as described above, a leakage current may be generated. In the display device according to an embodiment, the first transistor TR1 that may be a switching transistor may include an oxide semiconductor, thereby minimizing the leakage current. Further, the second transistor TR2 that may be a driving transistor may include a polycrystalline semiconductor, thereby having high electron mobility. For example, the switching transistor and the driving transistor may include different semiconductor materials, so they may be stably driven and they may have high reliability.

As described above, in the process for realizing high resolution, the size of the pixels may be reduced, and the length of the channel of the semiconductor may be reduced. To stably control a threshold voltage of the oxide semiconductor with a short channel, a process for forming an insulating layer near the first semiconductor 135 of the first transistor TR1 may be performed in a low hydrogen state. Therefore, the first interlayer insulating layer 161 contacting the bottom surface of the first semiconductor 135 may have a low hydrogen concentration. For example, the hydrogen concentration of the first interlayer insulating layer 161 may be less than about 1.0E+21 atoms/cm3. Further, the third gate insulating layer 143 contacting the top surface of the first semiconductor 135 may have a low hydrogen concentration. For example, the hydrogen concentration of the third gate insulating layer 143 may be less than about 1.14E+21 atoms/cm3. Further, the second interlayer insulating layer 162 contacting the third gate insulating layer 143 may have a low hydrogen concentration. For example, the hydrogen concentration of the second interlayer insulating layer 162 may be less than about 1.0E+22 atoms/cm3.

The first interlayer insulating layer 161, the third gate insulating layer 143, and the second interlayer insulating layer 162 disposed around the first semiconductor 135 including an oxide semiconductor may have a low hydrogen concentration. On the contrary, the first gate insulating layer 141 and the second gate insulating layer 142 may have a high hydrogen concentration. Therefore, the hydrogen concentration of the first interlayer insulating layer 161, the third gate insulating layer 143, and the second interlayer insulating layer 162 may be lower than the hydrogen concentration of the first gate insulating layer 141 and the second gate insulating layer 142.

Figure 2:
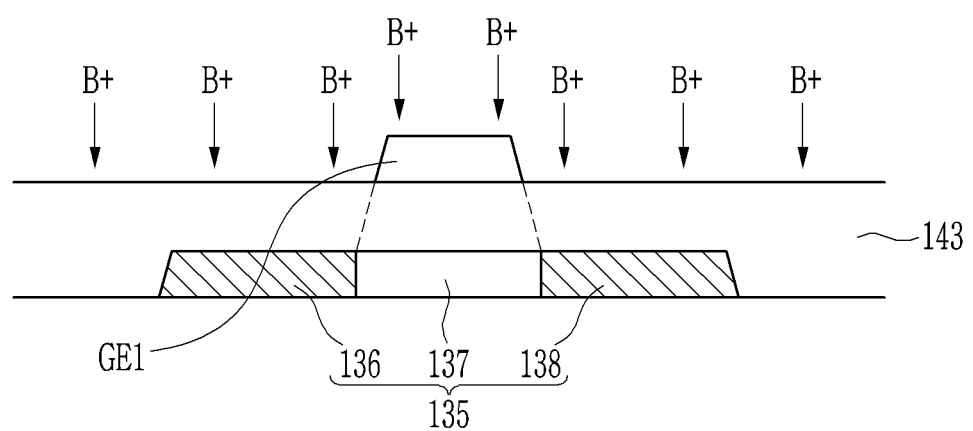
FIG. 2 shows a schematic cross-sectional view of part of a first transistor of a display device according to an embodiment.

However, the hydrogen concentration for functioning as a carrier of the first semiconductor 135 of the first transistor TR1 including an oxide semiconductor may be low, so an on-current of the first transistor TR1 may be reduced. In the display device according to an embodiment, as shown in FIG. 2, a carrier material may be doped to the first semiconductor 135, thereby preventing reduction of the on-current of the first transistor TR1. FIG. 2 shows a schematic cross-sectional view of part of a first transistor of a display device according to an embodiment, and FIG. 3 shows a schematic graph of an on-current before and after a first semiconductor of a first transistor of a display device according to an embodiment is doped.

Referring to FIG. 2, the third gate insulating layer 143 may be formed on the first semiconductor 135, and the first gate electrode GE1 may be formed on the third gate insulating layer 143. Boron (B) may be injected into a top surface of the third gate insulating layer 143 by using the first gate electrode GE1 as a mask. The boron (B) may not be injected into the channel region 137 overlapping the first gate electrode GE1, and it may be injected into the source region 136 and the drain region 138 not overlapping the first gate electrode GE1. Therefore, the source region 136 and the drain region 138 of the first semiconductor 135 may be doped with boron (B). A doping concentration of the source region 136 and the drain region 138 of the first semiconductor 135 may be equal to or greater than about 5E+18 cm-3. In this instance, the first semiconductor 135 may be doped with phosphorus (P), argon (Ar), xenon (Xe), krypton (Kr), or a combination thereof, in replacement of or in addition to boron (B). A carrier concentration of the first semiconductor 135 may increase through a process for doping the first semiconductor 135, and the on-current of the first transistor TR1 may increase as described.

Figure 3:
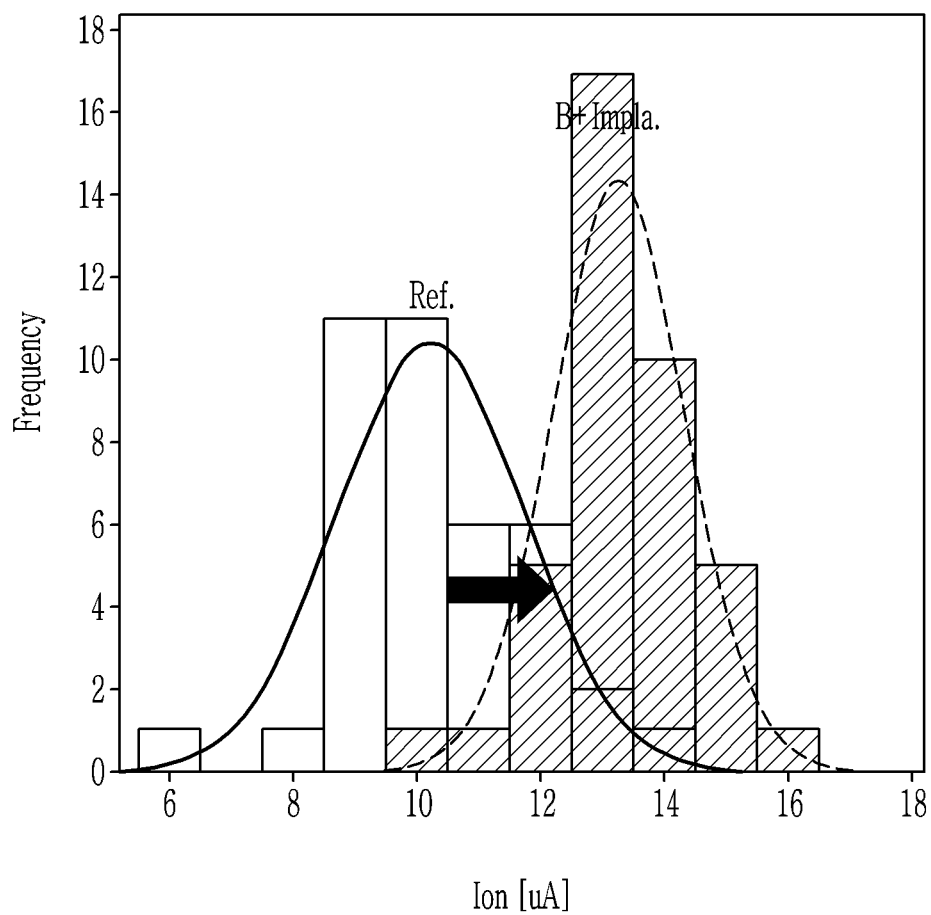
FIG. 3 shows a schematic graph of an on-current before and after a first semiconductor of a first transistor of a display device according to an embodiment is doped.

As shown in FIG. 3, the on-current (Ion) of the first transistor (Ref.) to which boron (B) may not be doped indicates a high frequency at about 9 μA to about 10 μA. The doping concentration of the source region and the drain region of the first semiconductor of the first transistor (B+ Impla.) to which boron (B) may be doped in the condition of about 35 kV may be about 1E+19 cm-3. In this instance, the on-current (Ion) of the first transistor indicates a high frequency at about 13 μA to about 14 μA. For example, it may be found that, by doping boron (B), the on-current of the first transistor TR1 increases.

Figure 4:
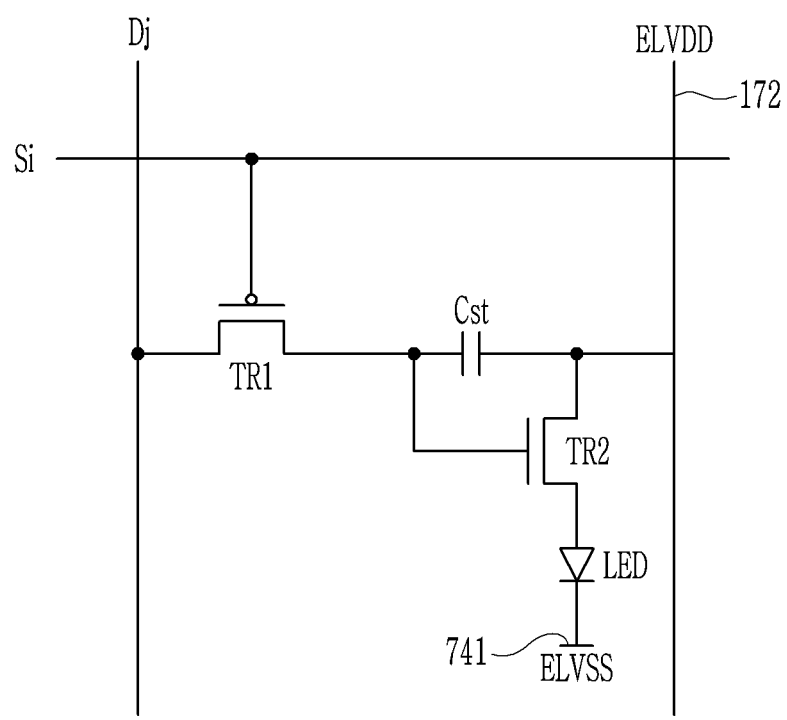
FIG. 4 shows a schematic circuit diagram of a display device according to an embodiment.

A circuit diagram of a display device according to an embodiment will now be described. FIG. 4 shows a schematic circuit diagram of a display device according to an embodiment.

Referring to FIG. 4, one pixel may include a second transistor TR2 for controlling the light emitting diode (LED), a first transistor TR1 for switching the second transistor TR2, and a storage capacitor Cst electrically connected to a driving voltage line 172. The first transistor TR1 that may be a switching transistor may include an oxide semiconductor, and the second transistor TR2 that may be a driving transistor may include a polycrystalline semiconductor.

The first transistor TR1 may include a gate electrode, a source electrode, and a drain electrode. The gate electrode of the first transistor TR1 may be electrically connected to an i-th scan wire (Si), and the source electrode may be electrically connected to a j-th data wire (Dj). The drain electrode of the first transistor TR1 may be electrically connected to the gate electrode of the second transistor TR2. The first transistor TR1 may transmit the data signal applied to the j-th data wire (Dj) to the second transistor TR2 according to a scanning signal applied to the i-th scan wire (Si).

The second transistor TR2 may include a gate electrode, a source electrode, and a drain electrode. The gate electrode of the second transistor TR2 may be electrically connected to the first transistor TR1, the source electrode may be electrically connected to the driving voltage line 172, and the drain electrode may be electrically connected to the light emitting diode (LED).

The light emitting diode (LED) may include an emission layer, and an anode and a cathode facing each other with the emission layer therebetween. The anode may be electrically connected to the drain electrode of the second transistor TR2. The cathode may be electrically connected to a common voltage line 741, and a common voltage may be applied. The emission layer may emit light according to an output signal of the second transistor TR2, so it may display an image by outputting light or outputting no light.

Here, the light output by the emission layer may be changeable by a material of the emission layer, and it may be colored light or white light.

The storage capacitor Cst may be electrically connected between the gate electrode and the source electrode of the second transistor TR2, and it may charge the data signal input to the gate electrode of the second transistor TR2 and may maintain the same.

FIG. 4 illustrates that one pixel may include two transistors TR1 and TR2, but embodiments are not limited thereto, and it may include one transistor and one capacitor, or at least three transistors and at least two capacitors. For example, as shown in FIG. 5, one pixel may include first to seventh transistors (T1 to T7) and a storage capacitor Cst.

A display device according to an embodiment will now be described with reference to FIG. 5.

The display device according to an embodiment described with reference to FIG. 5 mostly corresponds to the display device according to an exemplary embodiment described with reference to FIG. 1 to FIG. 4, so no repeated portions thereof will be described. An embodiment may be different from the above-described embodiment in that an embodiment may include at least three transistors, which will now be described.

Figure 5:
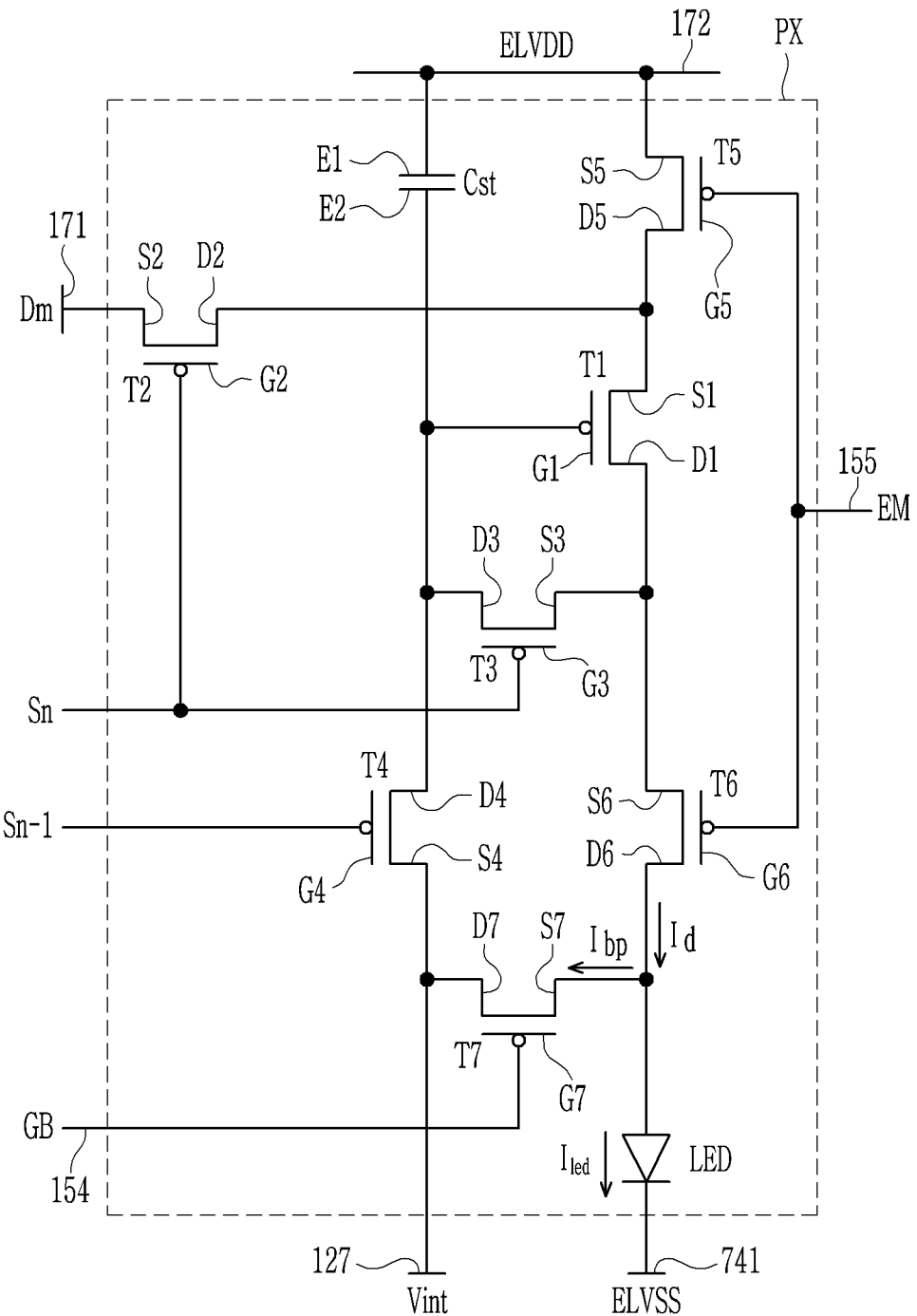
FIG. 5 shows a schematic circuit diagram of a display device according to an embodiment.

FIG. 5 shows a schematic circuit diagram of a display device according to an embodiment. Referring to FIG. 5, one pixel PX of the display device according to an embodiment may include transistors T1, T2, T3, T4, T5, T6, T7 electrically connected to various signal lines, a storage capacitor Cst, and a light emitting diode (LED).

The display device according to an embodiment may include a display area for displaying an image, and the pixel PX may be arranged in various forms in the display area.

The transistors T1, T2, T3, T4, T5, T6, and T7 include a driving transistor T1, switching transistors electrically connected to the scan line (Sn), for example, the second transistor T2 and the third transistor T3, and the remaining transistors may represent transistors (hereinafter, compensation transistors) for performing operations needed to operate the light emitting diode (LED). The compensation transistors T4, T5, T6, and T7 may include a fourth transistor T4, a fifth transistor T5, a sixth transistor T6, and a seventh transistor T7.

Signal lines may include a scan line (Sn), a previous-stage scan line Sn-1, an emission control line 155, a bypass control line 154, a data line 171, a driving voltage line 172, an initialization voltage line 127, and a common voltage line 741. The bypass control line 154 may be a portion of the previous-stage scan line Sn-1 or may be electrically connected thereto. In another way, the bypass control line 154 may be a portion of the scan line (Sn) or may be electrically connected thereto.

The scan line (Sn) may be electrically connected to a gate driver and transmit a scan signal to the second transistor T2 and the third transistor T3. The previous-stage scan line Sn-1 may be electrically connected to the gate driver, and transmits a previous-stage scan signal applied to the pixel PX disposed on a previous stage to the fourth transistor T4. The emission control line 155 may be electrically connected to the emission controller, and transmit the emission control signal for controlling a time for the light emitting diode (LED) to emit light to the fifth transistor T5 and the sixth transistor T6. The bypass control line 154 may transmit a bypass signal to the seventh transistor T7.

The data line 171 may represent a wire for transmitting the data voltage by the data driver, and luminance of light emitted by the light emitting diode (LED) may change according to the data voltage. The driving voltage line 172 may apply a driving voltage. The initialization voltage line 127 may transmit an initialization voltage for initializing the driving transistor T1. The common voltage line 741 may apply a common voltage. Constant voltages may be applied to the driving voltage line 172, the initialization voltage line 127, and the common voltage line 741.

Transistors will now be described.

The driving transistor T1 may represent a transistor for controlling the size of a current that may be output according to the applied data voltage. The output driving current (Id) may be applied to the light emitting diode (LED) to control brightness of the light emitting diode (LED) according to the data voltage. For this purpose, a first electrode S1 of the driving transistor T1 may be disposed to receive the driving voltage. The first electrode S1 may pass through the fifth transistor T5 and may be electrically connected to the driving voltage line 172. Further, the first electrode S1 of the driving transistor T1 may be electrically connected to the second electrode D2 of the second transistor T2 to receive the data voltage. A second electrode (D1, output electrode) of the driving transistor T1 may be disposed to output a current to the light emitting diode (LED). The second electrode D1 of the driving transistor T1 passes through the sixth transistor T6 and may be electrically connected to the anode of the light emitting diode (LED). The gate electrode G1 may be electrically connected to one electrode (or a second storage electrode E2) of the storage capacitor Cst. Hence, the voltage at the gate electrode G1 may change according to the voltage stored in the storage capacitor Cst, and the driving current (Id) output by the driving transistor T1 may change.

The second transistor T2 may represent a transistor for receiving the data voltage in the pixel PX. The gate electrode G2 may be electrically connected to the scan line (Sn), and the first electrode S2 may be electrically connected to the data line 171. The second electrode D2 of the second transistor T2 may be electrically connected to the first electrode S1 of the driving transistor T1. In case that the second transistor T2 may be turned on according to the scan signal transmitted through the scan line (Sn), the data voltage transmitted through the data line 171 may be transmitted to the first electrode S1 of the driving transistor T1.

The third transistor T3 may represent a transistor for transmitting the compensation voltage that may be changed by allowing the data voltage to pass through the driving transistor T1 to the second storage electrode E2 of the storage capacitor Cst. The gate electrode G3 may be electrically connected to the scan line (Sn), and the first electrode S3 may be electrically connected to the second electrode D1 of the driving transistor T1. The second electrode D3 of the third transistor T3 may be electrically connected to the second storage electrode E2 of the storage capacitor Cst and the gate electrode G1 of the driving transistor T1. The third transistor T3 may be turned on according to the scan signal received through the scan line (Sn) to connect the gate electrode G1 of the driving transistor T1 and the second electrode D1, and to connect the second electrode D1 of the driving transistor T1 and the second storage electrode E2 of the storage capacitor Cst.

The fourth transistor T4 may initialize the gate electrode G1 of the driving transistor T1 and the second storage electrode E2 of the storage capacitor Cst. The gate electrode G4 may be electrically connected to a previous-stage scan line Sn-1, and the first electrode S4 may be electrically connected to the initialization voltage line 127. The second electrode D4 of the fourth transistor T4 may be electrically connected to the second storage electrode E2 of the storage capacitor Cst and the gate electrode G1 of the driving transistor T1 through the second electrode D3 of the third transistor T3. The fourth transistor T4 may transmit the initialization voltage to the gate electrode G1 of the driving transistor T1 and the second storage electrode E2 of the storage capacitor Cst according to the previous-stage scan signal received through the previous-stage scan line Sn-1. Accordingly, the gate voltage at the gate electrode G1 of the driving transistor T1 and the storage capacitor Cst may be initialized. The initialization voltage may have a low voltage value, and it may be a voltage for turning on the driving transistor T1.

The fifth transistor T5 may transmit the driving voltage to the driving transistor T1. The gate electrode G5 may be electrically connected to the emission control line 155, and the first electrode S5 may be electrically connected to the driving voltage line 172. A second electrode D5 of the fifth transistor T5 may be electrically connected to the first electrode S1 of the driving transistor T1.

The sixth transistor T6 may transmit the driving current (Id) output by the driving transistor T1 to the light emitting diode (LED). The gate electrode G6 may be electrically connected to the emission control line 155, and the first electrode S6 may be electrically connected to the second electrode D1 of the driving transistor T1. A second electrode D6 of the sixth transistor T6 may be electrically connected to the anode of the light emitting diode (LED).

The fifth transistor T5 and the sixth transistor T6 may be turned on according to the emission control signal received through the emission control line 155, and in case that the driving voltage may be applied to the first electrode S1 of the driving transistor T1 through the fifth transistor T5, the driving transistor T1 may output the driving current (Id) according to the voltage (i.e., the voltage at the second storage electrode E2 of the storage capacitor Cst) at the gate electrode G1 of the driving transistor T1. The output driving current (Id) may be transmitted to the light emitting diode (LED) through the sixth transistor T6. As the current (Iled) flows to the light emitting diode (LED), the light emitting diode (LED) may emit light.

The seventh transistor T7 may initialize the anode of the light emitting diode (LED). The gate electrode G7 may be electrically connected to the bypass control line 154, the first electrode S7 may be electrically connected to the anode of the light emitting diode (LED), and the second electrode D7 may be electrically connected to the initialization voltage line 127. The bypass control line 154 may be electrically connected to the previous-stage scan line Sn-1, and the bypass signal may be applied as a signal with a same timing as the previous-stage scan signal. The bypass control line 154 may not be electrically connected to the previous-stage scan line Sn-1, and it may transmit a signal that may be different from the previous-stage scan signal. In case that the seventh transistor T7 may be turned on according to the bypass signal (GB), the initialization voltage may be applied to the anode of the light emitting diode (LED) to be initialized.

The first storage electrode E1 of the storage capacitor Cst may be electrically connected to the driving voltage line 172, and the second storage electrode E2 may be electrically connected to the gate electrode G1 of the driving transistor T1, the second electrode D3 of the third transistor T3, and the second electrode D4 of the fourth transistor T4. As a result, the second storage electrode E2 may determine the voltage at the gate electrode G1 of the driving transistor T1, and receive the data voltage through the second electrode D3 of the third transistor T3 or receive the initialization voltage through the second electrode D4 of the fourth transistor T4.

On the other hand, the anode of the light emitting diode (LED) may be electrically connected to the second electrode D6 of the sixth transistor T6 and the first electrode S7 of the seventh transistor T7, and the cathode may be electrically connected to the common voltage line 741 for transmitting a common voltage.

It has been described above that one pixel may include seven transistors (T1 to T7) and one storage capacitor Cst, but embodiments are not limited thereto, and a number of transistors, a number of capacitors, and their connection relationships are modifiable in various ways.

In an embodiment, the driving transistor T1 may include a polycrystalline semiconductor. Further, the third transistor T3 and the fourth transistor T4 may include an oxide semiconductor. The second transistor T2, the fifth transistor T5, the sixth transistor T6, and the seventh transistor T7 may include polycrystalline semiconductors. However, they are not limited thereto, and at least one of the second transistor T2, the fifth transistor T5, the sixth transistor T6, and the seventh transistor T7 may include an oxide semiconductor. In an embodiment, the third transistor T3 and the fourth transistor T4 may be allowed to include semiconductor materials that may be different from those of the driving transistor T1, so they may be driven more stably and reliability may be improved.

In an embodiment, the third transistor T3 and the fourth transistor T4 may have a similar structure to the first transistor TR1 in the previous embodiment. Further, in an embodiment, the driving transistor T1 may have a similar structure to the second transistor TR2 in the previous embodiment. Therefore, insulating layers disposed around the third transistor T3 and the fourth transistor T4 may have a low hydrogen concentration, and the insulating layers disposed around the driving transistor T1 may have a high hydrogen concentration. Further, semiconductors of the third transistor T3 and the fourth transistor T4 may be doped with one or more materials such as boron (B), phosphorus (P), argon (Ar), xenon (Xe), and krypton (Kr).

A display device according to an embodiment will now be described with reference to FIG. 6 to FIG. 14.

The display device according to an embodiment described with reference to FIG. 6 mostly corresponds to the display device according to an embodiment described with reference to FIG. 1 to FIG. 4 and the display device according to an embodiment described with reference to FIG. 5, so no repeated descriptions will be provided. An embodiment may further include a boost capacitor, which may be different from the above-described embodiment, which will now be described in further detail.

One pixel of a display device according to an embodiment will now be described with reference to FIG. 6.

Figure 6:
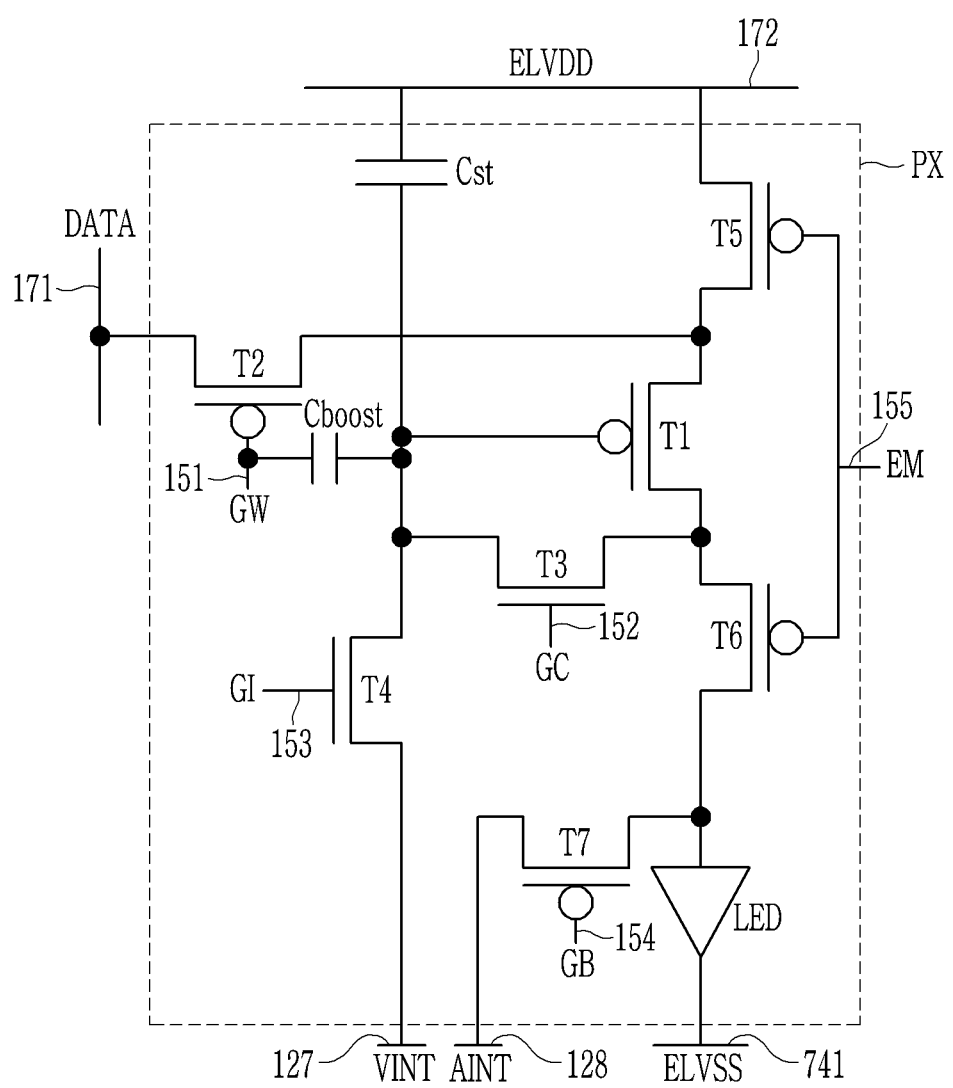
FIG. 6 shows a schematic circuit diagram of a display device according to an embodiment.

FIG. 6 shows a schematic circuit diagram of a display device according to an embodiment. One pixel PX of the display device according to an embodiment may include transistors T1, T2, T3, T4, T5, T6, and T7 electrically connected to signal lines, a storage capacitor Cst, a boost capacitor (Cboost), and a light emitting diode (LED).

The display device according to an embodiment may include a display area for displaying an image, and the pixel PX may be arranged in various ways in the display area.

One pixel PX may be electrically connected to signal lines 127, 128, 151, 152, 153, 154, 155, 171, 172, and 741. Signal lines may include a first initialization voltage line 127, a second initialization voltage line 128, a scan line 151, an inverted scan line 152, an initialization control line 153, a bypass control line 154, an emission control line 155, a data line 171, a driving voltage line 172, and a common voltage line 741.

The scan line 151 may be electrically connected to a gate driver (not shown) to transmit a scan signal (GW) to the second transistor T2. The inverted scan line 152 may receive a voltage with an opposite polarity to the voltage applied to the scan line 151 at a same timing as the signal of the scan line 151. For example, in case that a high voltage may be applied to the scan line 151, a low voltage may be applied to the inverted scan line 152. The inverted scan line 152 may transmit an inverted scan signal (GC) to the third transistor T3.

The initialization control line 153 may transmit the initialization control signal (GI) to the fourth transistor T4. The bypass control line 154 transmits the bypass signal (GB) to the seventh transistor T7. The bypass control line 154 may be formed of a subsequent-stage scan line 151. The emission control line 155 may transmit the emission control signal (EM) to the fifth transistor T5 and the sixth transistor T6.

The data line 171 may represent a wire for transmitting a data voltage (DATA) generated by a data driver (not shown), so luminance of light emitted by the light emitting diode (LED) may change according to the data voltage (DATA) applied to the pixel PX.

The driving voltage line 172 may apply a driving voltage (ELVDD). The first initialization voltage line 127 may transmit a first initialization voltage (VINT), and the second initialization voltage line 128 may transmit a second initialization voltage (AINT). The common voltage line 741 applies the common voltage (ELVSS) to the cathode of the light emitting diode (LED). In an embodiment, constant voltages may be applied to the driving voltage line 172, the first and second initialization voltage lines 127 and 128, and the common voltage line 741.

A structure of transistors and a connection relationship thereof will now be described.

The driving transistor T1 may have a p-type transistor characteristic, and may include a polycrystalline semiconductor. The driving transistor T1 may represent a transistor for controlling the size of the current output to the anode of the light emitting diode (LED) according to the data voltage (DATA) applied to the gate electrode of the driving transistor T1. Brightness of the light emitting diode (LED) may be controlled according to the size of the driving current output to the anode of the light emitting diode (LED), so luminance of the light emitting diode (LED) may be controlled according to the data voltage (DATA) applied to the pixel PX. For this purpose, the first electrode of the driving transistor T1 may be disposed to receive the driving voltage (ELVDD), so it may be electrically connected to the driving voltage line 172 through the fifth transistor T5. Further, the first electrode of the driving transistor T1 may be electrically connected to the second electrode of the second transistor T2 to receive the data voltage (DATA). On the other hand, the second electrode of the driving transistor T1 may be disposed to output a current to the light emitting diode (LED), and it may be electrically connected to the anode of the light emitting diode (LED) through the sixth transistor T6. Further, the second electrode of the driving transistor T1 transmits the data voltage (DATA) applied to the first electrode to the third transistor T3. On the other hand, the gate electrode of the driving transistor T1 may be electrically connected to one electrode (hereinafter, a second storage electrode) of the storage capacitor Cst. Hence, the voltage at the gate electrode of the driving transistor T1 changes according to the voltage stored in the storage capacitor Cst, and the driving current output by the driving transistor T1 accordingly changes. Further, the storage capacitor Cst functions to maintain the voltage at the gate electrode of the driving transistor T1 for one frame.

The second transistor T2 may have a p-type transistor characteristic, and it may include a polycrystalline semiconductor. The second transistor T2 receives the data voltage (DATA) into the pixel PX. The gate electrode of the second transistor T2 may be electrically connected to the scan line 151 and the first electrode of the boost capacitor (Cboost). The first electrode of the second transistor T2 may be electrically connected to the data line 171. The second electrode of the second transistor T2 may be electrically connected to the first electrode of the driving transistor T1. In case that the second transistor T2 may be turned on by the low voltage from among the scan signal (GW) received through the scan line 151, the data voltage (DATA) received through the data line 171 may be transmitted to the first electrode of the driving transistor T1.

The third transistor T3 may have an n-type transistor characteristic, and it may include an oxide semiconductor. The third transistor T3 electrically connects the second electrode of the driving transistor T1 and the gate electrode of the driving transistor T1. As a result, it may be a transistor for allowing the compensation voltage generated in case that the data voltage (DATA) passes through the driving transistor T1 to reach the second storage electrode of the storage capacitor Cst. The gate electrode of the third transistor T3 may be electrically connected to the inverted scan line 152, and the first electrode of the third transistor T3 may be electrically connected to the second electrode of the driving transistor T1. The second electrode of the third transistor T3 may be electrically connected to the second storage electrode of the storage capacitor Cst, the gate electrode of the driving transistor T1, and the second electrode of the boost capacitor (Cboost). The third transistor T3 may be turned on by the high voltage from among the inverted scan signal (GC) received through the inverted scan line 152, connect the gate electrode of the driving transistor T1 and the second electrode of the driving transistor T1, and transmit the voltage applied to the gate electrode of the driving transistor T1 to the second storage electrode of the storage capacitor Cst to store the same in the storage capacitor Cst.

The fourth transistor T4 may have an n-type transistor characteristic, and may include an oxide semiconductor. The fourth transistor T4 may function to initialize the gate electrode of the driving transistor T1 and the second storage electrode of the storage capacitor Cst. The gate electrode of the fourth transistor T4 may be electrically connected to the initialization control line 153, and the first electrode of the fourth transistor T4 may be electrically connected to the first initialization voltage line 127. The second electrode of the fourth transistor T4 may pass through the second electrode of the third transistor T3 and may be electrically connected to the second storage electrode of the storage capacitor Cst, the gate electrode of the driving transistor T1, and the second electrode of the boost capacitor (Cboost). The fourth transistor T4 may be turned on by the high voltage from among the initialization control signal (GI) received through the initialization control line 153, and in this instance, it may transmit the first initialization voltage (VINT) to the gate electrode of the driving transistor T1 and the second storage electrode of the storage capacitor Cst. Accordingly, the voltages at the gate electrode of the driving transistor T1 and the storage capacitor Cst may be initialized.

The fifth transistor T5 may include a p-type transistor characteristic, and it may include a polycrystalline semiconductor. The fifth transistor T5 may transmit the driving voltage (ELVDD) to the driving transistor T1. The gate electrode of the fifth transistor T5 may be electrically connected to the emission control line 155, the first electrode of the fifth transistor T5 may be electrically connected to the driving voltage line 172, and the second electrode of the fifth transistor T5 may be electrically connected to the first electrode of the driving transistor T1.

The sixth transistor T6 may have a p-type transistor characteristic, and it may include a polycrystalline semiconductor. The sixth transistor T6 may transmit the driving current output by the driving transistor T1 to the light emitting diode (LED). The gate electrode of the sixth transistor T6 may be electrically connected to the emission control line 155, the first electrode of the sixth transistor T6 may be electrically connected to the second electrode of the driving transistor T1, and the second electrode of the sixth transistor T6 may be electrically connected to the anode of the light emitting diode (LED).

The seventh transistor T7 may have a p-type transistor characteristic, and it may include a polycrystalline semiconductor. The seventh transistor T7 may initialize the anode of the light emitting diode (LED). The gate electrode of the seventh transistor T7 may be electrically connected to the bypass control line 154, the first electrode of the seventh transistor T7 may be electrically connected to the anode of the light emitting diode (LED), and the second electrode of the seventh transistor T7 may be electrically connected to the second initialization voltage line 128. In case that the seventh transistor T7 may be turned on by the low voltage from among the bypass signal (GB), the second initialization voltage (AINT) may be applied to the anode of the light emitting diode (LD) to be initialized.

It has been described that one pixel may include seven transistors (T1 to T7), one storage capacitor Cst, and one boost capacitor (Cboost), but embodiments are not limited thereto, and the number of transistors, the number of capacitors, and their connection relationships are modifiable in various ways.

In an embodiment, the driving transistor T1 may include a polycrystalline semiconductor. Further, the third transistor T3 and the fourth transistor T4 may include oxide semiconductors. The second transistor T2, the fifth transistor T5, the sixth transistor T6, and the seventh transistor T7 may include polycrystalline semiconductors. However, they are not limited thereto, and at least one of the second transistor T2, the fifth transistor T5, the sixth transistor T6, and the seventh transistor T7 may include an oxide semiconductor. In an embodiment, as the third transistor T3 and the fourth transistor T4 may include the semiconductor materials that may be different from those of the driving transistor T1, they may be stably driven, and reliability may be improved.

As described above, in case that a high voltage may be applied to the scan line 151, a low voltage may be applied to the inverted scan line 152, and in case that a low voltage may be applied to the scan line 151, a high voltage may be applied to the inverted scan line 152. For example, the inverted scan signal (GC) applied to the inverted scan line 152 may be configured with the scan signal (GW) applied to the scan line 151 and an inverted signal, so it may lower the gate voltage of the driving transistor T1 after the data may be programmed. On the contrary, the scan signal (GW) may lift the gate voltage of the driving transistor T1. Therefore, in case that a black voltage may be programmed, the black voltage may be reduced. In an embodiment, the boost capacitor (Cboost) may be disposed between the scan line 151 for applying the scan signal (GW) and the gate electrode of the driving transistor T1, so the gate voltage of the driving transistor T1 may be increased and the black voltage may be stably output.

An increment of the gate voltage of the driving transistor T1 by the boost capacitor (Cboost) may be defined to be a boosting voltage. The boosting voltage may be determined by Equation 1.

$$Vb = \frac{Cboost}{Cst + Cboost} \times (VGH - VGL) \qquad \text{(Equation 1)}$$

(Vb: a boosting voltage, Cboost: capacitance of the boost capacitor, Cst: capacitance of the storage capacitor, VGH: high voltage, and VGL: low voltage)

Therefore, as the capacitance of the boost capacitor (Cboost) increases, the gate voltage of the driving transistor T1 may further increase. The gate voltage of the driving transistor T1 may be controlled by controlling capacitance of the boost capacitor (Cboost).

In an embodiment, the third transistor T3 and the fourth transistor T4 may have a similar structure to the first transistor TR1 in an embodiment described with reference to FIG. 1 to FIG. 4. In an embodiment, the driving transistor T1 may have a similar structure to the second transistor TR2 according to an embodiment described with reference to FIG. 1 to FIG. 4. Therefore, the insulating layers disposed around the third transistor T3 and the fourth transistor T4 may have a low hydrogen concentration, and the insulating layers disposed around the driving transistor T1 may have a high hydrogen concentration. Further, semiconductors of the third transistor T3 and the fourth transistor T4 may be doped with one or more materials such as boron (B), phosphorus (P), argon (Ar), xenon (Xe), and krypton (Kr). Also, the boost capacitor (Cboost) may be doped with one or more materials such as boron (B), phosphorus (P), argon (Ar), xenon (Xe), and krypton (Kr).

Planar and cross-sectional structures of a driving transistor T1, a third transistor T3, a fourth transistor T4, and a boost capacitor (Cboost) will now be described with reference to FIG. 7 to FIG. 9.

Figure 7:
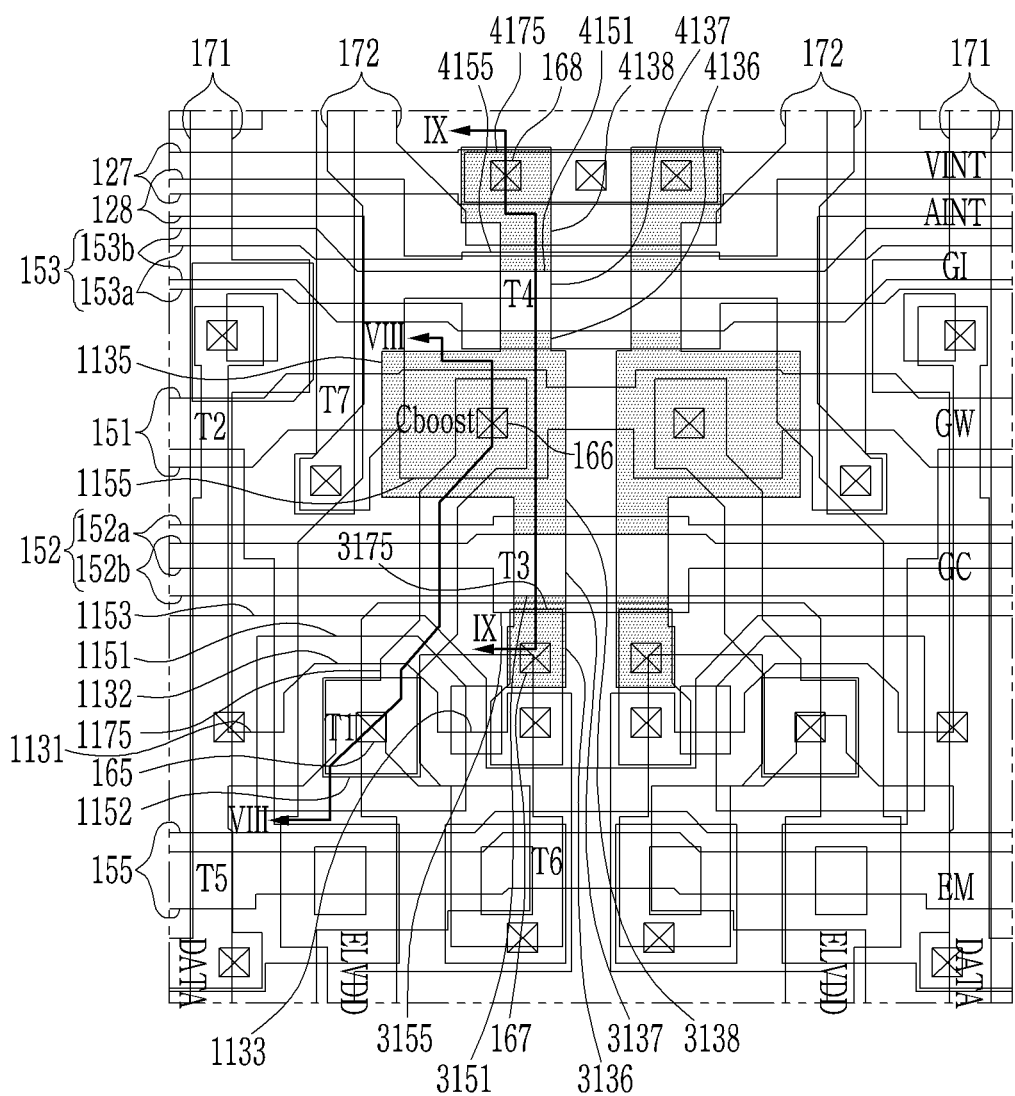
FIG. 7 shows a schematic top plan view of a display device according to an embodiment.
Figure 8:
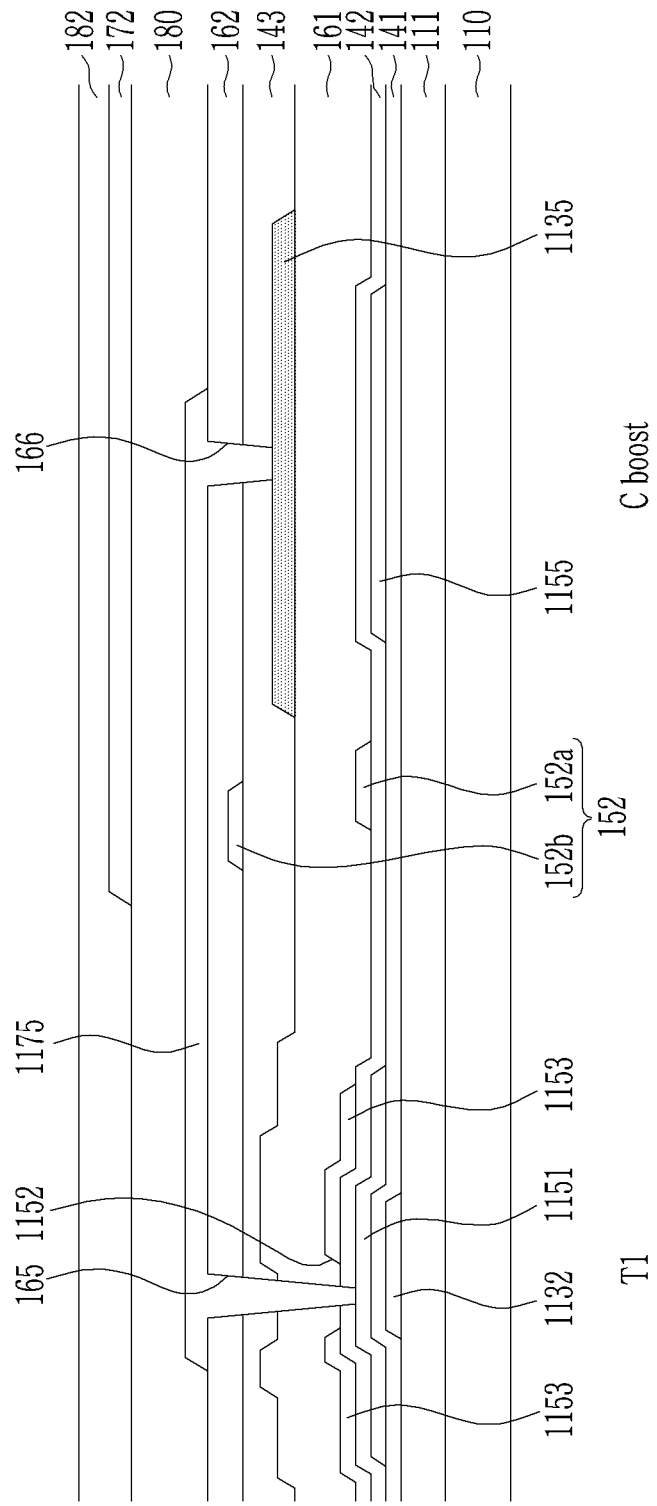
FIG. 8 shows a schematic cross-sectional view with respect to line VIII-VIII of FIG. 7.
Figure 9:
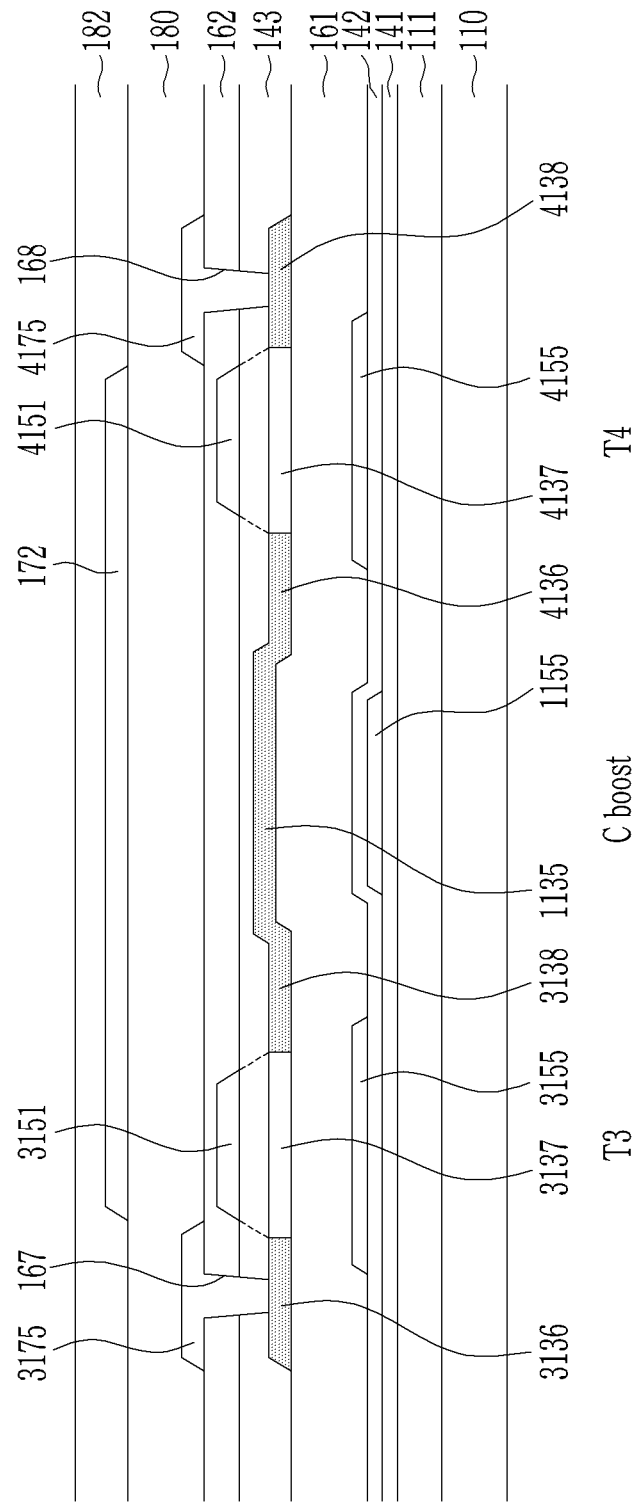
FIG. 9 shows a schematic cross-sectional view with respect to line IX-IX of FIG. 7.

FIG. 7 shows a schematic top plan view of a display device according to an embodiment, FIG. 8 shows a schematic cross-sectional view with respect to line VIII-VIII of FIG. 7, and FIG. 9 shows a schematic cross-sectional view with respect to line IX-IX of FIG. 7. FIG. 7 to FIG. 9 illustrate two adjacent pixels, and the two pixels may be symmetrical to each other. The pixel disposed on the left will be described. Further, the seventh transistor T7 may be electrically connected to the subsequent-stage scan line 151, which is not illustrated, and the previous-stage seventh transistor T7 is illustrated.

As shown in FIG. 7 to FIG. 9, a polycrystalline semiconductor including a channel 1132, a first electrode 1131, and a second electrode 1133 of the driving transistor T1 may be disposed on the substrate 110. The polycrystalline semiconductor may further include channels, first electrodes, and second electrodes of the second transistor T2, the fifth transistor T5, the sixth transistor T6, and the seventh transistor T7 in addition to the driving transistor T1.

The channel 1132 of the driving transistor T1 may be formed to be bent in a plan view. However, the shape of the channel 1132 of the driving transistor T1 is not limited thereto, and it may be modifiable in many ways. For example, the channel 1132 of the driving transistor T1 may be bent into another shape, and it may be formed to have a bar shape. The first electrode 1131 and the second electrode 1133 of the driving transistor T1 may be disposed on respective sides of the channel 1132 of the driving transistor T1. The first electrode 1131 of the driving transistor T1 may extend upward and downward on a plane, and the portion extending upward may be electrically connected to the second electrode of the second transistor T2, while the portion extending downward may be electrically connected to the second electrode of the fifth transistor T5. The second electrode 1133 of the driving transistor T1 may extend downward on a plane and may be electrically connected to the first electrode of the sixth transistor T6.

A buffer layer 111 may be disposed between the substrate 110 and the polycrystalline semiconductor including the channel 1132, the first electrode 1131, and the second electrode 1133 of the driving transistor T1. The buffer layer 111 may have a single-layer or multilayer structure. The buffer layer 111 may include an organic insulating material and/or an inorganic insulating material.

A first gate insulating layer 141 may be disposed on the polycrystalline semiconductor including the channel 1132, the first electrode 1131, and the second electrode 1133 of the driving transistor T1. The first gate insulating layer 141 may include a silicon nitride, a silicon oxide, or a combination thereof.

A first gate conductor including a gate electrode 1151 of the driving transistor T1 and a first electrode 1155 of the boost capacitor (Cboost) may be disposed on the first gate insulating layer 141. The first gate conductor may further include a scan line 151 and an emission control line 155. The scan line 151 and the emission control line 155 may substantially extend in a horizontal direction.

The gate electrode 1151 of the driving transistor T1 may overlap the channel 1132 of the driving transistor T1. For example, the channel 1132 of the driving transistor T1 may be covered by the gate electrode 1151 of the driving transistor T1. The first electrode 1155 of the boost capacitor (Cboost) may extend to the right and left on the plane and may be electrically connected to the gate electrode of the second transistor T2 and the scan line 151.

The first gate conductor including the gate electrode 1151 of the driving transistor T1 and the first electrode 1155 of the boost capacitor (Cboost) may be formed, and a doping process may be (e.g., then be) performed. The polycrystalline semiconductor covered by the first gate conductor may not be doped, and a portion of the polycrystalline semiconductor not covered by the first gate conductor may be doped to have a same characteristic as a conductor. In this instance, the doping process may be performed with a p-type dopant, and the driving transistor T1 including a polycrystalline semiconductor, the second transistor T2, the fifth transistor T5, the sixth transistor T6, and the seventh transistor T7 may have a p-type transistor characteristic.

A second gate insulating layer 142 may be disposed on the first gate conductor including the gate electrode 1151 of the driving transistor T1 and the first electrode 1155 of the boost capacitor (Cboost) and the first gate insulating layer 141. The second gate insulating layer 142 may include a silicon nitride, a silicon oxide, or a combination thereof.

A second gate conductor including a first storage electrode 1153 of the storage capacitor Cst may be disposed on the second gate insulating layer 142.

The first storage electrode 1153 may overlap the gate electrode 1151 of the driving transistor T1 to configure a storage capacitor Cst. An opening 1152 may be formed in the first storage electrode 1153 of the storage capacitor Cst. The opening 1152 of the first storage electrode 1153 of the storage capacitor Cst may overlap the gate electrode 1151 of the driving transistor T1.

The second gate conductor may further include an initialization voltage line 127, a lower initialization control line 153a, and a lower inverted scan line 152a. The initialization voltage line 127, the lower initialization control line 153a, and the lower inverted scan line 152a may substantially extend in the horizontal direction. The second gate conductor may further include a light blocking layer 3155 of the third transistor T3 and a light blocking layer 4155 of the fourth transistor T4. The light blocking layer 3155 of the third transistor T3 may overlap a channel 3137 and a gate electrode 3151 of the third transistor T3. The light blocking layer 4155 of the fourth transistor T4 may overlap a channel 4137 and a gate electrode 4151 of the fourth transistor T4.

A first interlayer insulating layer 161 may be disposed on the second gate conductor including the first storage electrode 1153 of the storage capacitor Cst. The first interlayer insulating layer 161 may include a silicon nitride, a silicon oxide, or a combination thereof.

An oxide semiconductor including a channel 3137, a first electrode 3136, and a second electrode 3138 of the third transistor T3, a channel 4137, a first electrode 4138, and a second electrode 4136 of the fourth transistor T4, and a second electrode 1135 of the boost capacitor (Cboost) may be disposed on the first interlayer insulating layer 161. The oxide semiconductor may include a metal oxide, and for example, it may include an indium-gallium-zinc oxide (IGZO).

The channel 3137, the first electrode 3136, and the second electrode 3138 of the third transistor T3, the channel 4137, the first electrode 4138, and the second electrode 4136 of the fourth transistor T4, and the second electrode 1135 of the boost capacitor (Cboost) may be electrically connected to each other. The first electrode 3136 and the second electrode 3138 of the third transistor T3 may be disposed on respective sides of the channel 3137 of the third transistor T3. The first electrode 4138 and the second electrode 4136 of the fourth transistor T4 may be disposed on respective sides of the channel 4137 of the fourth transistor T4. The second electrode 1135 of the boost capacitor (Cboost) may be electrically connected to the second electrode 3138 of the third transistor T3. The second electrode 1135 of the boost capacitor (Cboost) may be electrically connected to the second electrode 4136 of the fourth transistor T4. The second electrode 1135 of the boost capacitor (Cboost) may overlap the first electrode 1155. Capacitance of the boost capacitor (Cboost) may be determined by an overlapping area of the first electrode 1155 and the second electrode 1135 of the boost capacitor (Cboost), and thicknesses of the second gate insulating layer 142 and the first interlayer insulating layer 161 disposed between the first electrode 1155 and the second electrode 1135.

A third gate insulating layer 143 may be disposed on the oxide semiconductor including the channel 3137, the first electrode 3136, and the second electrode 3138 of the third transistor T3, the channel 4137, the first electrode 4138, and the second electrode 4136 of the fourth transistor T4, and the second electrode 1135 of the boost capacitor (Cboost). The third gate insulating layer 143 may be disposed on the top surface (e.g., entire top surface) of the oxide semiconductor and the first interlayer insulating layer 161. Therefore, the third gate insulating layer 143 may cover top surfaces and side surfaces of the channel 3137, the first electrode 3136, and the second electrode 3138 of the third transistor T3, and the channel 4137, the first electrode 4138, and the second electrode 4136 of the fourth transistor T4.

As described in the above embodiment, in a process for realizing high resolution, the size of the pixels may be reduced, and the length of the channel of the semiconductor may be accordingly reduced. In this instance, in case that the third gate insulating layer 143 does not cover the first electrode 3136 and the second electrode 3138 of the third transistor T3, and the top surfaces of the first electrode 4138 and the second electrode 4136 of the fourth transistor T4, a portion of the material of the oxide semiconductor may move to a side surface of the third gate insulating layer 143. In an embodiment, as the third gate insulating layer 143 may be disposed on the top surface (e.g., entire top surface) of the oxide semiconductor and the first interlayer insulating layer 161, the oxide semiconductor and the gate electrode 3151 of the third transistor T3 may be prevented from being short-circuited, and the oxide semiconductor and the gate electrode 4151 of the fourth transistor T4 may be prevented from being short-circuited.

However, an embodiment is not limited thereto, and the third gate insulating layer 143 may not be disposed on the top surface of the oxide semiconductor and the first interlayer insulating layer 161. For example, the third gate insulating layer 143 may overlap the channel 3137 of the third transistor T3, and it may not overlap the first electrode 3136 and the second electrode 3138. The third gate insulating layer 143 may overlap the channel 4137 of the fourth transistor T4, and it may not overlap the first electrode 4138 and the second electrode 4136.

A third gate conductor including the gate electrode 3151 of the third transistor T3 and the gate electrode 4151 of the fourth transistor T4 may be disposed on the third gate insulating layer 143.

The gate electrode 3151 of the third transistor T3 may overlap the channel 3137 of the third transistor T3. The gate electrode 3151 of the third transistor T3 may be electrically connected to the inverted scan line 152. In this instance, the gate electrode 3151 of the third transistor T3 may be electrically connected to an upper inverted scan line 152b. The gate electrode 4151 of the fourth transistor T4 may overlap the channel 4137 of the fourth transistor T4. The gate electrode 4151 of the fourth transistor T4 may be electrically connected to the initialization control line 153. In this instance, the gate electrode 4151 of the fourth transistor T4 may be electrically connected to an upper initialization control line 153b.

The third gate conductor may further include the upper initialization control line 153b and the upper inverted scan line 152b. The upper initialization control line 153b and the upper inverted scan line 152b may substantially extend in the horizontal direction. The upper initialization control line 153b may configure an initialization control line 153 with the lower initialization control line 153a. The upper inverted scan line 152b may configure an inverted scan line 152 with the lower inverted scan line 152a.

A second interlayer insulating layer 162 may be disposed on the third gate conductor including the gate electrode 3151 of the third transistor T3 and the gate electrode 4151 of the fourth transistor T4.

A first opening 165, a second opening 166, a third opening 167, and a fourth opening 168 may be formed in the second interlayer insulating layer 162 and the third gate insulating layer 143. The first opening 165 may overlap at least part of the gate electrode 1151 of the driving transistor T1. The first opening 165 may further be formed in the first interlayer insulating layer 161 and the second gate insulating layer 142 in addition to the second interlayer insulating layer 162 and the third gate insulating layer 143. The first opening 165 may overlap the opening 1152 of the first storage electrode 1153. The first opening 165 may be disposed inside the opening 1152 of the first storage electrode 1153. The second opening 166 may overlap at least part of the second electrode 1135 of the boost capacitor (Cboost). The third opening 167 may overlap at least part of the first electrode 3136 of the third transistor T3. The fourth opening 168 may overlap at least part of the first electrode 4138 of the fourth transistor T4.

A first connection electrode 1175, a second connection electrode 3175, and a third connection electrode 4175 may be disposed on the second interlayer insulating layer 162. The first connection electrode 1175 may be electrically connected to the gate electrode 1151 of the driving transistor T1 through the first opening 165 and the opening 1152 of the first storage electrode 1153. The first connection electrode 1175 may be electrically connected to the second electrode 1135 of the boost capacitor (Cboost) through the second opening 166. Therefore, the gate electrode 1151 of the driving transistor T1 may be electrically connected to the second electrode 1135 of the boost capacitor (Cboost) by the first connection electrode 1175. The second connection electrode 3175 may be electrically connected to the first electrode 3136 of the third transistor T3 through the third opening 167. The second connection electrode 3175 may be electrically connected to the sixth transistor T6. Therefore, the first electrode 3136 of the third transistor T3 may be electrically connected to the sixth transistor T6 by the second connection electrode 3175. The third connection electrode 4175 may be electrically connected to the first electrode 4138 of the fourth transistor T4 through the fourth opening 168. The third connection electrode 4175 may be electrically connected to the initialization voltage line 127. Therefore, the first electrode 4138 of the fourth transistor T4 may be electrically connected to the initialization voltage line 127 by the third connection electrode 4175.

A third interlayer insulating layer 180 may be disposed on the first connection electrode 1175, the second connection electrode 3175, and the third connection electrode 4175.

A data line 171 and a driving voltage line 172 may be disposed on the third interlayer insulating layer 180. The data line 171 and the driving voltage line 172 may substantially extend in a vertical direction. The data line 171 may be electrically connected to the second transistor T2. The driving voltage line 172 may be electrically connected to the fifth transistor T5.

A passivation layer 182 may be disposed on the data line 171 and the driving voltage line 172. Although not shown, an anode may be disposed on the passivation layer 182. The anode may be electrically connected to the sixth transistor T6, and may receive an output current of the driving transistor T1. A partition wall may be disposed on the anode. An opening may be formed in the partition wall, and the opening of the partition wall may overlap the anode. A light-emitting device layer may be disposed in the opening of the partition wall. A cathode may be disposed on the light-emitting device layer and the partition wall. The anode, the light-emitting device layer, and the cathode may configure a light emitting diode (LED).

Regarding the display device according to an embodiment, the driving transistor T1 may include a polycrystalline semiconductor, and the third transistor T3 and the fourth transistor T4 may include oxide semiconductors. As described above, the third transistor T3 and the fourth transistor T4 include semiconductor materials that may be different from those of the driving transistor T1, so they may be stably driven, and reliability may be improved.

Further, in the process for realizing high resolution, the size of the pixels may be reduced, and the length of the channel of the semiconductor may be accordingly reduced. To stably control a threshold voltage of the oxide semiconductor with a short channel, the process for forming an insulating layer disposed around the oxide semiconductors of the third transistor T3 and the fourth transistor T4 may be performed in a low hydrogen state. Therefore, the first interlayer insulating layer 161 contacting the bottom surface of the oxide semiconductor may have a low hydrogen concentration. For example, the hydrogen concentration of the first interlayer insulating layer 161 may be less than about 1.0E+21 atoms/cm3. Also, the third gate insulating layer 143 contacting the top surface of the oxide semiconductor may have a low hydrogen concentration. For example, the hydrogen concentration of the third gate insulating layer 143 may be less than about 1.14E+21 atoms/cm3. The second interlayer insulating layer 162 contacting the third gate insulating layer 143 may have a low hydrogen concentration. For example, the hydrogen concentration of the second interlayer insulating layer 162 may be less than about 1.0E+22 atoms/cm3.

The first interlayer insulating layer 161, the third gate insulating layer 143, and the second interlayer insulating layer 162 disposed around the oxide semiconductor as described above may have a low hydrogen concentration. On the contrary, the first gate insulating layer 141 and the second gate insulating layer 142 may have a high hydrogen concentration. Therefore, the hydrogen concentration of the first interlayer insulating layer 161, the third gate insulating layer 143, and the second interlayer insulating layer 162 may be lower than the hydrogen concentration of the first gate insulating layer 141 and the second gate insulating layer 142.

Figure 10:
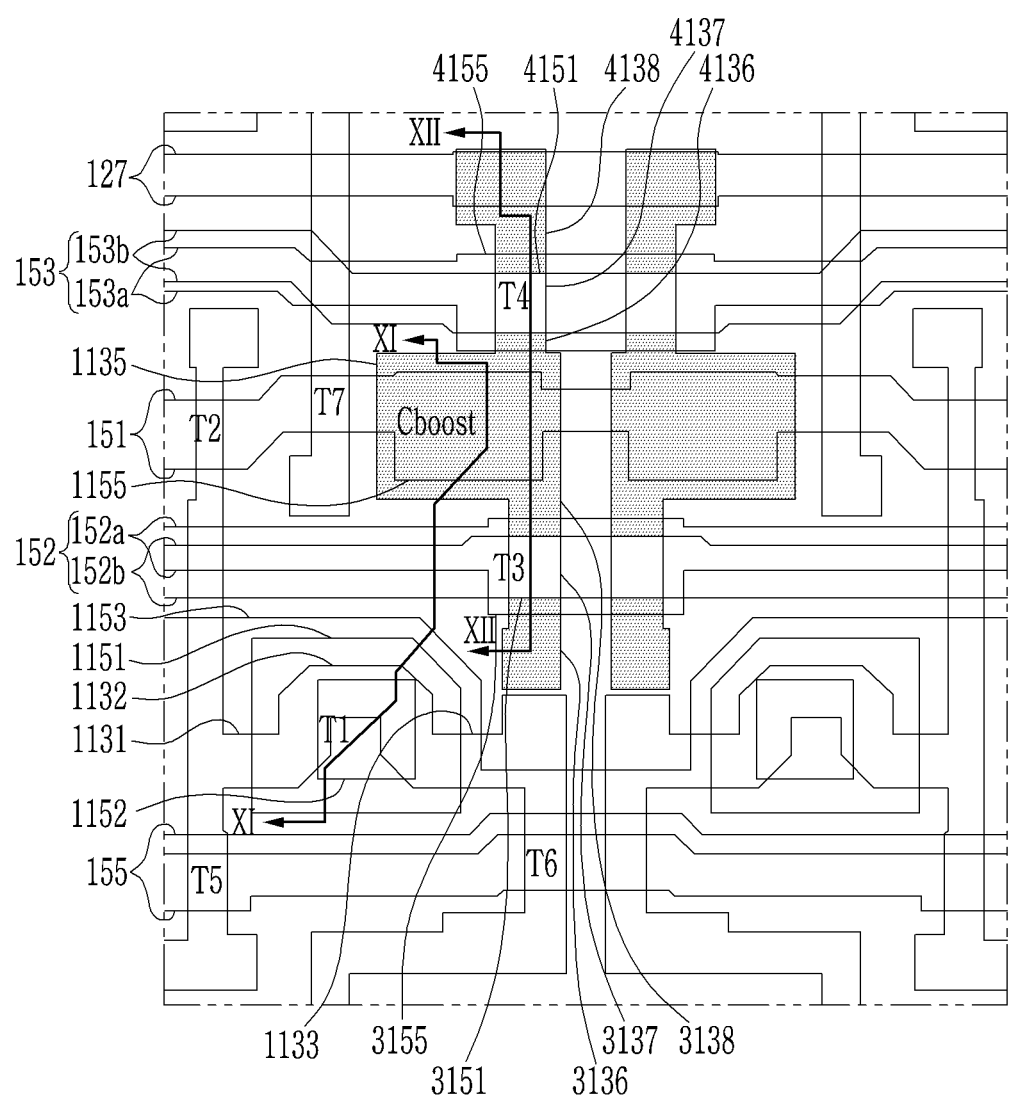
FIG. 10 shows a schematic top plan view of part of layers of a display device according to an embodiment.
Figure 11:
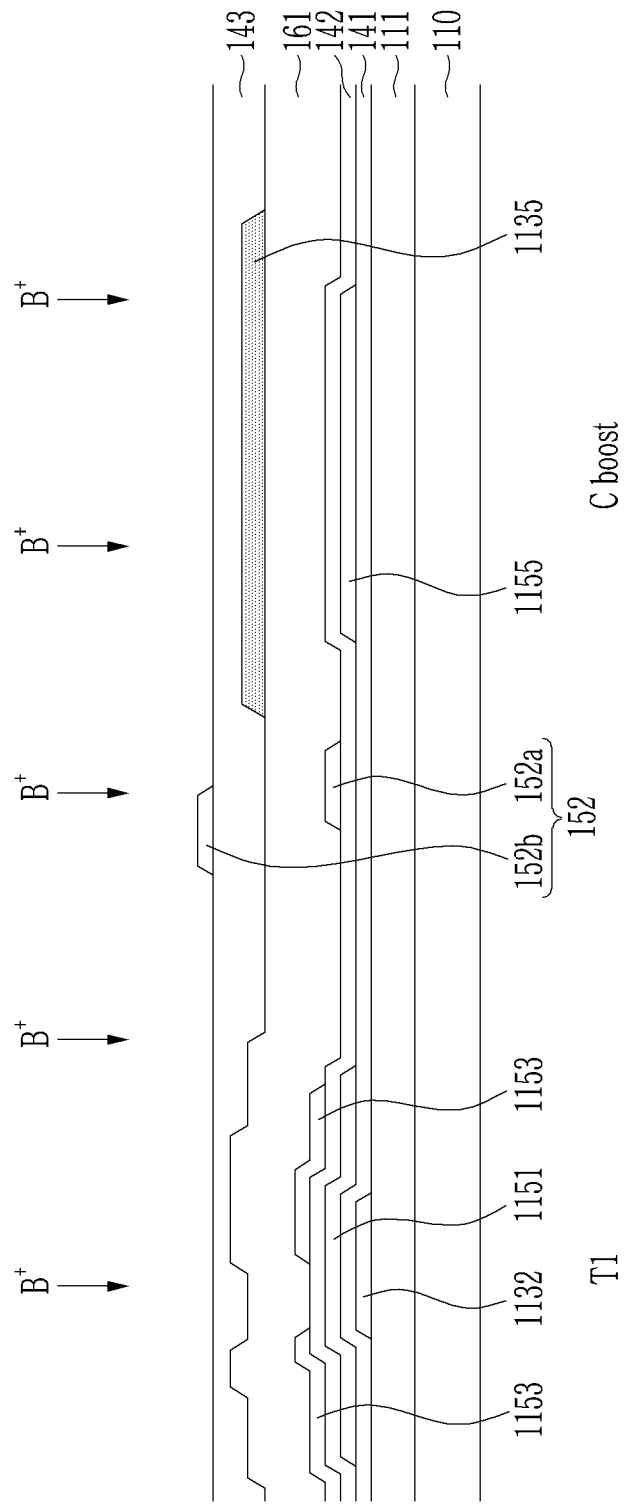
FIG. 11 shows a schematic cross-sectional view with respect to line XI-XI of FIG. 10.
Figure 12:
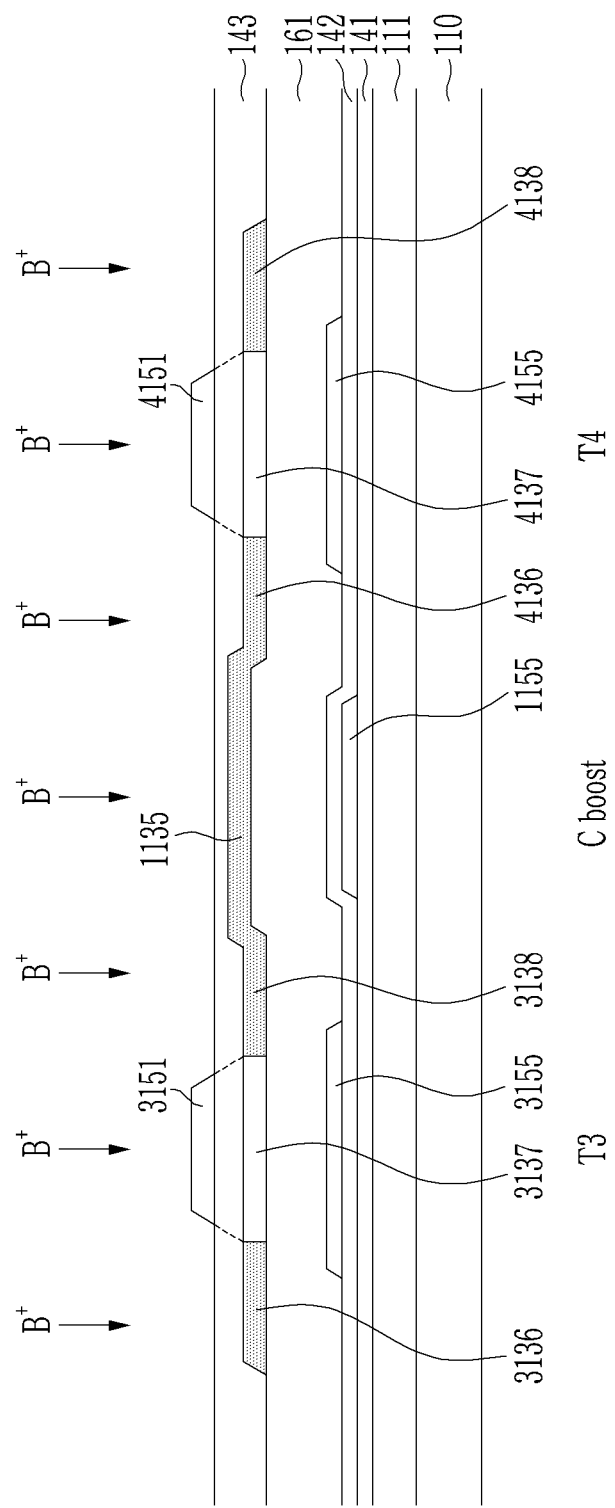
FIG. 12 shows a schematic cross-sectional view with respect to line XII-XII of FIG. 10.
Figure 13:
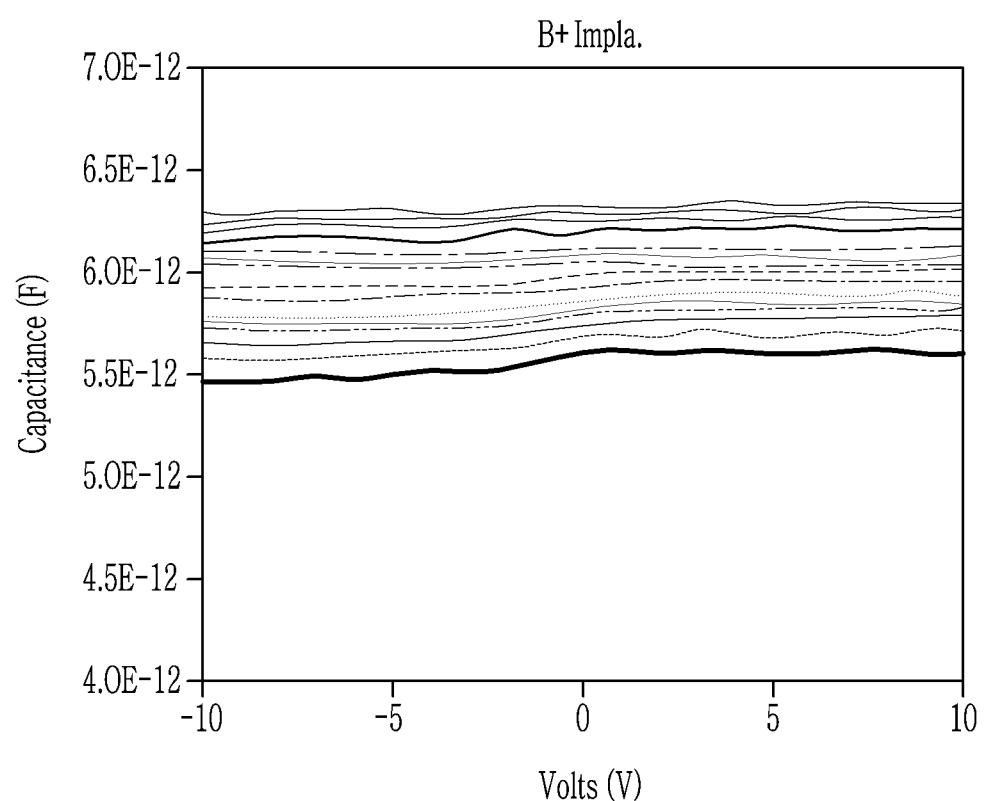
FIG. 13 shows a schematic graph of a voltage-capacitance characteristic of a boost capacitor in a display device according to an embodiment.

However, as the hydrogen concentration functioning as a carrier of the oxide semiconductor may be low, the on-currents of the third transistor T3 and the fourth transistor T4 may be reduced, and the second electrode 1135 of the boost capacitor (Cboost) may indicate the characteristic of the semiconductor. Regarding the display device according to an embodiment, as shown in FIG. 10 to FIG. 12, by doping the carrier material to the oxide semiconductor, the on-currents of the third transistor T3 and the fourth transistor T4 may be prevented from being reduced, and the second electrode 1135 of the boost capacitor (Cboost) may be prevented from having the characteristic of the semiconductor. FIG. 10 shows a schematic top plan view of part of layers of a display device according to an embodiment, FIG. 11 shows a schematic cross-sectional view with respect to line XI-XI of FIG. 10, and FIG. 12 shows a schematic cross-sectional view with respect to line XII-XII of FIG. 10. FIG. 13 shows a schematic graph of a voltage-capacitance characteristic of a boost capacitor in a display device according to an embodiment, and FIG. 14 shows a schematic graph of a voltage-capacitance characteristic of a boost capacitor in a display device according to a comparative example.

Referring to FIG. 10 to FIG. 13, a third gate insulating layer 143 may be formed on the oxide semiconductor, and the gate electrode 3151 of the third transistor T3 and the gate electrode 4151 of the fourth transistor T4 may be formed on the third gate insulating layer 143. The boron (B) may be injected into the top surface of the third gate insulating layer 143 by using the gate electrode 3151 of the third transistor T3 and the gate electrode 4151 of the fourth transistor T4 as a mask. The boron (B) may not be injected into the channel 3137 of the third transistor T3 and the channel 4137 of the fourth transistor T4 overlapping the gate electrode 3151 of the third transistor T3 and the gate electrode 4151 of the fourth transistor T4. The boron (B) may be injected into the first electrode 3136 and the second electrode 3138 not overlapping the gate electrode 3151 of the third transistor T3, and it may be injected into the first electrode 4138 and the second electrode 4136 not overlapping the gate electrode 4151 of the fourth transistor T4. Further, the boron (B) may be injected into the entire region of the second electrode 1135 of the boost capacitor (Cboost). Therefore, the first electrode 3136 and the second electrode 3138 of the third transistor T3, the first electrode 4138 and the second electrode 4136 of the fourth transistor T4, and the second electrode 1135 of the boost capacitor (Cboost) may be doped with boron (B). The doping concentration of the first electrode 3136 and the second electrode 3138 of the third transistor T3, the first electrode 4138 and the second electrode 4136 of the fourth transistor T4, and the second electrode 1135 of the boost capacitor (Cboost) may be equal to or greater than about $5E^{+18}$ cm$^{-3}$. In this instance, the oxide semiconductor may be doped with phosphorus (P), argon (Ar), xenon (Xe), krypton (Kr), or a combination thereof, in replacement of or in addition to boron (B). The carrier concentration of the oxide semiconductor increases through the process for doping an oxide semiconductor, and the on-currents of the third transistor T3 and the fourth transistor T4 may increase. Further, a semiconducting behavior of the second electrode 1135 of the boost capacitor (Cboost) may be improved.

Figure 14:
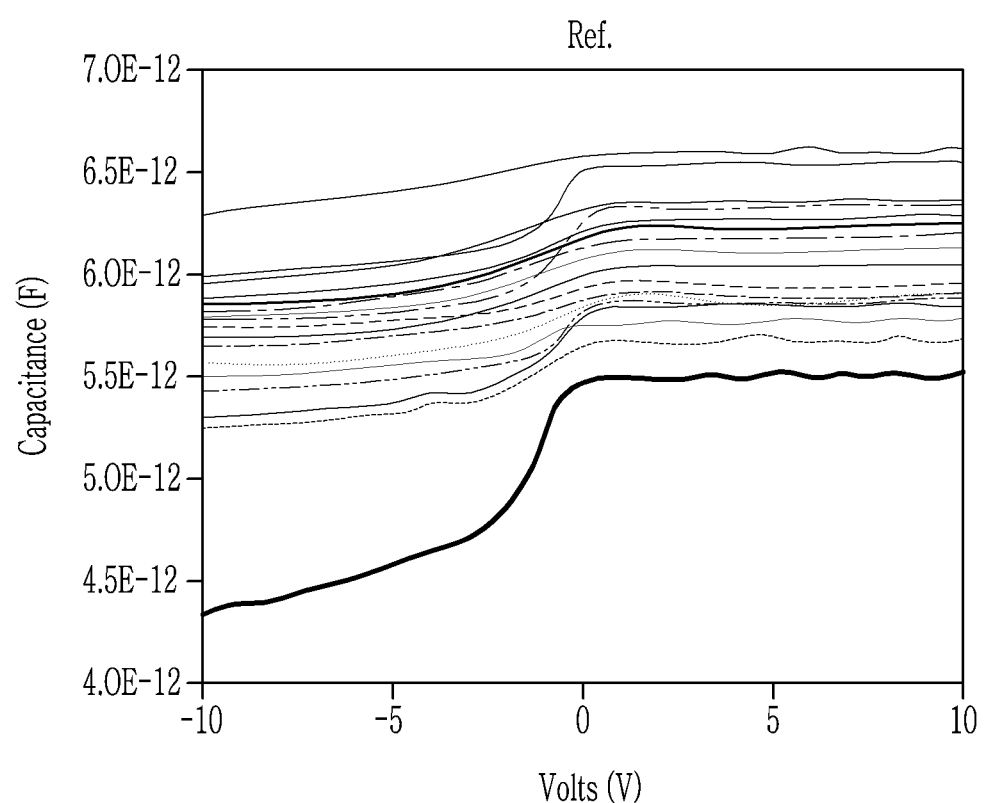
FIG. 14 shows a schematic graph of a voltage-capacitance characteristic of a boost capacitor in a display device according to a Comparative Example.

In the case of the boost capacitor (Cboost) that may not be doped with the boron (B) in FIG. 14, it has an excellent capacitance characteristic in the section of 0 volts to 10 volts, but the capacitance steeply reduces in the section of 0 volts to −10 volts. This may be because the second electrode 1135 of the boost capacitor (Cboost) has a semiconducting behavior. In FIG. 13, the doping concentration of the boost capacitor (Cboost) in case that the boron (B) is doped at about 35 kV may be about $1E^{+19}$ cm$^{-3}$, and it may be found that it has an excellent capacitance characteristic in the entire voltage section. This may be because the second electrode 1135 of the boost capacitor (Cboost) may be entirely doped to show the characteristic of the conductor.

While this disclosure has been described in connection with what is considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
   a polycrystalline semiconductor including a channel, a first electrode, and a second electrode of a driving transistor disposed on a substrate;
   a first gate insulating layer disposed on the polycrystalline semiconductor;
   a gate electrode of the driving transistor disposed on the first gate insulating layer and overlapping a channel of the driving transistor;
   a first electrode of a boost capacitor disposed on the first gate insulating layer;
   a second gate insulating layer disposed on the gate electrode of the driving transistor and the first electrode of the boost capacitor;
   a first interlayer insulating layer disposed on the second gate insulating layer;
   an oxide semiconductor disposed on the first interlayer insulating layer, and including:
      a channel, a first electrode, and a second electrode of a second transistor;
      a channel, a first electrode, and a second electrode of a third transistor; and
      a second electrode of a boost capacitor;
   a third gate insulating layer disposed on the oxide semiconductor;
   a gate electrode of the second transistor disposed on the third gate insulating layer, and overlapping the channel of the second transistor;
   a gate electrode of the third transistor disposed on the third gate insulating layer, and overlapping the channel of the third transistor; and
   a second interlayer insulating layer disposed on the gate electrode of the second transistor and the gate electrode of the third transistor, wherein a hydrogen concentration of the first interlayer insulating layer, the third gate insulating layer, and the second interlayer insulating layer is lower than a hydrogen concentration of the first gate insulating layer and the second gate insulating layer, and the first electrode and the second electrode of the second transistor of the oxide semiconductor, the first electrode and the second electrode of the third transistor, and the second electrode of the boost capacitor are doped with at least one selected from the group consisting of boron, phosphorus, argon, xenon, and krypton.

2. The display device of claim 1, wherein
the third gate insulating layer is disposed on a top surface of the oxide semiconductor and the first interlayer insulating layer.

3. The display device of claim 2, wherein the third gate insulating layer is disposed on a substantially entire surface of the top surface of the oxide semiconductor and the first interlayer insulating layer.

4. The display device of claim 3, wherein
the third gate insulating layer covers the top surface and a side surface of the oxide semiconductor.

5. The display device of claim 1, wherein
a hydrogen concentration of the first interlayer insulating layer is less than about $1.0E^{+21}$ atoms/cm$^3$.

6. The display device of claim 1, wherein
a hydrogen concentration of the third gate insulating layer is less than about $1.14E^{+21}$ atoms/cm$^3$.

7. The display device of claim 1, wherein
a hydrogen concentration of the second interlayer insulating layer is less than about $1.0E^{+22}$ atoms/cm$^3$.

8. The display device of claim 1, wherein
a doping concentration of a source region and a drain region of the oxide semiconductor is equal to or greater than about $5E^{+18}$ cm$^{-3}$.

9. A display device comprising:
a light emitting diode electrically connected between a driving voltage line for applying a driving voltage and a common voltage line for applying a common voltage;
a driving transistor electrically connected between the driving voltage line and the light emitting diode;
a second transistor electrically connected between a first electrode of the driving transistor electrically connected to the driving voltage line and a data line for applying a data voltage;
a third transistor electrically connected between a second electrode of the driving transistor electrically connected to the light emitting diode and a gate electrode of the driving transistor;
a fourth transistor electrically connected between the gate electrode of the driving transistor and a first initialization voltage line for applying a first initialization voltage;
a storage capacitor electrically connected between the driving voltage line and the gate electrode of the driving transistor; and
a boost capacitor electrically connected between a gate electrode of the second transistor and the gate electrode of the driving transistor.

10. The display device of claim 9, wherein
the gate electrode of the second transistor is electrically connected to a scan line for applying a scan signal,
a gate electrode of the third transistor is electrically connected to an inverted scan line for applying an inverted scan signal, and
a voltage with an opposite polarity to a voltage applied to the scan line is applied to the inverted scan line, wherein the voltage with the opposite polarity and the voltage applied to the scan line are simultaneously applied.

11. The display device of claim 9, wherein
the driving transistor and the second transistor include a polycrystalline semiconductor,
the third transistor and the fourth transistor include an oxide semiconductor, and
at least part of the oxide semiconductor is doped with at least one selected from the group consisting of boron, phosphorus, argon, xenon, and krypton.

12. The display device of claim 11, wherein
the driving transistor and the second transistor are p-type transistors, and
the third transistor and the fourth transistor are n-type transistors.

13. The display device of claim 11, wherein
the boost capacitor includes an electrode electrically connected to the gate electrode of the driving transistor, and
the electrode of the boost capacitor is doped with at least one selected from the group consisting of boron, phosphorus, argon, xenon, and krypton.

14. The display device of claim 11, further comprising:
a fifth transistor electrically connected between the driving voltage line and the first electrode of the driving transistor;
a sixth transistor electrically connected between the first electrode of the driving transistor and the light emitting diode; and
a seventh transistor electrically connected between a second initialization voltage line for applying a second initialization voltage and the light emitting diode.

15. A display device comprising:
a polycrystalline semiconductor disposed on a substrate;
a first gate insulating layer disposed on the polycrystalline semiconductor;
a driving gate electrode disposed on the first gate insulating layer;
a second gate insulating layer disposed on the driving gate electrode;
a first interlayer insulating layer disposed on the second gate insulating layer;
an oxide semiconductor disposed on the first interlayer insulating layer;
a third gate insulating layer disposed on the oxide semiconductor;
a switching gate electrode disposed on the third gate insulating layer; and
a second interlayer insulating layer disposed on the switching gate electrode, wherein
a hydrogen concentration of the first interlayer insulating layer, the third gate insulating layer, and the second interlayer insulating layer is lower than a hydrogen concentration of the first gate insulating layer and the second gate insulating layer,
the oxide semiconductor includes a channel, a source region, and a drain region, and
the source region and the drain region of the oxide semiconductor are doped with at least one selected from the group consisting of boron, phosphorus, argon, xenon, and krypton.

16. The display device of claim 15, wherein
the third gate insulating layer is disposed on a substantially entire surface of a top surface of the oxide semiconductor and the first interlayer insulating layer, and the third gate insulating layer covers the channel of the oxide semiconductor, and a top surface and a side surface of the source region and the drain region of the oxide semiconductor.

17. The display device of claim 15, wherein a hydrogen concentration of the first interlayer insulating layer is less than about $1.0E^{+21}$ atoms/cm$^3$.

18. The display device of claim 15, wherein a hydrogen concentration of the third gate insulating layer is less than about $1.14E^{+21}$ atoms/cm$^3$.

19. The display device of claim 15, wherein a hydrogen concentration of the second interlayer insulating layer is less than about $1.0E^{+22}$ atoms/cm$^3$.

20. The display device of claim 15, wherein a doping concentration of the source region and the drain region of the oxide semiconductor is equal to or greater than about $5E^{+18}$ cm$^{-3}$.

* * * * *